United States Patent
Nguyen et al.

(10) Patent No.: US 10,163,490 B2
(45) Date of Patent: Dec. 25, 2018

(54) P-TYPE FIELD-EFFECT TRANSISTOR (PFET)-BASED SENSE AMPLIFIERS FOR READING PFET PASS-GATE MEMORY BIT CELLS, AND RELATED MEMORY SYSTEMS AND METHODS

(71) Applicant: QUALCOMM Incorporated, San Diego, CA (US)

(72) Inventors: Hoan Huu Nguyen, Durham, NC (US); Francois Ibrahim Atallah, Raleigh, NC (US); Keith Alan Bowman, Morrisville, NC (US); David Joseph Winston Hansquine, Raleigh, NC (US); Jihoon Jeong, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/862,483

(22) Filed: Sep. 23, 2015

(65) Prior Publication Data
US 2016/0247555 A1   Aug. 25, 2016

Related U.S. Application Data

(60) Provisional application No. 62/119,767, filed on Feb. 23, 2015.

(51) Int. Cl.
| | | |
|---|---|---|
| *G11C 11/419* | (2006.01) | |
| *G11C 7/06* | (2006.01) | |
| *G11C 7/08* | (2006.01) | |
| *G11C 11/412* | (2006.01) | |
| *G11C 11/418* | (2006.01) | |

(52) U.S. Cl.
CPC .......... *G11C 11/419* (2013.01); *G11C 7/065* (2013.01); *G11C 7/08* (2013.01); *G11C 11/412* (2013.01); *G11C 11/418* (2013.01)

(58) Field of Classification Search
CPC ......... G11C 11/419; G11C 7/065; G11C 7/08; G11C 11/412
See application file for complete search history.

(56) References Cited

U.S. PATENT DOCUMENTS

| | | |
|---|---|---|
| 4,623,989 A | 11/1986 | Blake |
| 4,660,177 A | 4/1987 | O'Connor |

(Continued)

OTHER PUBLICATIONS

Cheng, K-L, et al., "A Highly Scaled, High Performance 45nm Bulk Logic CMOS Technology with 0.242 $\mu m^2$ SRAM Cell," IEDM 2007, IEEE International Electron Devices Meeting, Washington, DC, 2007, pp. 243-246.

(Continued)

*Primary Examiner* — J. H. Hur
*Assistant Examiner* — Jerome Leboeuf
(74) *Attorney, Agent, or Firm* — W&T/Qualcomm

(57) ABSTRACT

P-type Field-effect Transistor (PFET)-based sense amplifiers for reading PFET pass-gate memory bit cells ("bit cells"). Related methods and systems are also disclosed. Sense amplifiers are provided in a memory system to sense bit line voltage(s) of the bit cells for reading the data stored in the bit cells. It has been observed that as node technology is scaled down in size, PFET drive current (i.e., drive strength) exceeds N-type Field-effect Transistor (NFET) drive current due for like-dimensioned FETs. In this regard, in one aspect, PFET-based sense amplifiers are provided in a memory system to increase memory read times to the bit cells, and thus improve memory read performance.

31 Claims, 15 Drawing Sheets

(56) References Cited

U.S. PATENT DOCUMENTS

| | | | |
|---|---|---|---|
| 5,701,095 | A | 12/1997 | Ohsawa |
| 5,771,190 | A | 6/1998 | Okamura |
| 6,067,256 | A * | 5/2000 | Yamashita ............... G11C 7/12 365/189.04 |
| 6,205,068 | B1 | 3/2001 | Yoon |
| 6,449,202 | B1 | 9/2002 | Akatsu et al. |
| 7,038,962 | B2 | 5/2006 | Yamagami |
| 7,064,584 | B2 | 6/2006 | Bertram et al. |
| 7,256,621 | B2 | 8/2007 | Lih et al. |
| 7,403,426 | B2 | 7/2008 | Hamzaoglu et al. |
| 8,427,896 | B1 | 4/2013 | Agarwal et al. |
| 8,488,369 | B2 | 7/2013 | Chandra et al. |
| 8,576,649 | B1 | 11/2013 | Nemati |
| 2002/0179940 | A1 | 12/2002 | Osada et al. |
| 2003/0063511 | A1* | 4/2003 | Hsu ........................ G11C 7/12 365/204 |
| 2004/0100844 | A1* | 5/2004 | Alvandpour ............ G11C 7/12 365/208 |
| 2005/0207210 | A1 | 9/2005 | Barth, Jr. et al. |
| 2007/0211517 | A1 | 9/2007 | Burnett |
| 2008/0002497 | A1* | 1/2008 | Barth, Jr. ................ G11C 7/12 365/205 |
| 2014/0003160 | A1 | 1/2014 | Trivedi et al. |
| 2014/0153323 | A1* | 6/2014 | Liaw .................. H01L 27/0207 365/156 |
| 2014/0204687 | A1* | 7/2014 | Sinangil ................ G11C 29/52 365/189.11 |
| 2014/0269018 | A1 | 9/2014 | Jin et al. |
| 2015/0009751 | A1 | 1/2015 | Kulkarni et al. |
| 2015/0078103 | A1* | 3/2015 | Roy ........................ G11C 7/08 365/189.05 |
| 2015/0085568 | A1 | 3/2015 | Gulati et al. |
| 2015/0091609 | A1 | 4/2015 | Srinath et al. |

OTHER PUBLICATIONS

Chik R.Y.V., "Design Techniques for Low-Voltage BiCMOS Digital Circuits," Dissertation, 1996, 127 Pages.

Diaz, C. H., et al., "32nm Gate-First High-k/Metal-Gate Technology for High Performance Low Power Applications," IEDM 2008, IEEE International Electron Devices Meeting, San Francisco, CA, 2008, pp. 1-4.

Fung, Samuel K. H., et al., "65 nm CMOS High Speed, General Purpose and Low Power Transistor Technology for High Volume Foundry Application," 2004 Symposium on VLSI Technology, Digest of Technical Papers, IEEE, Jun. 15-17, 2004, pp. 92-93.

Jeong, J., et al., "A 16nm Configurable Pass-Gate Bit-Cell Register File for Quantifying the VMIN Advantage of PFET versus NFET Pass-Gate Bit Cells," Proceedings of the IEEE Custom Integrated Circuits Conference (CICC), Sep. 2015, 4 pages.

Wu, C. C., et al., "A 90-nm CMOS Device Technology with High-speed, General-purpose, and Low-leakage Transistors for System on Chip Applications," IEDM '02, International Electron Devices Meeting, San Francisco, CA, Dec. 8-11, 2002, pp. 65-68.

Wu, C.C., et al., "High Performance 22/20nm FinFET CMOS Devices with Advanced High-K/Metal Gate Scheme," 2010 IEEE International Electron Devices Meeting (IEDM), San Francisco, CA, Dec. 6-8, 2010, pp. 27.1.1-27.1.4.

Wu, S-Y., et al., "A 16nm FinFET CMOS Technology for Mobile SoC and Computing Applications," 2013 IEEE International Electron Devices Meeting (IEDM), Dec. 9-11, 2013, Washington, DC, pp. 9.1.1-9.1.4.

Young, K. K., et al., "A 0.13 µm CMOS Technology with 193 nm Lithography and Cu/Low-k for High Performance Applications," 2000 International Electron Devices Meeting, IEDM Technical Digest, Dec. 10-13, 2000, pp. 23.2.1-23.2.4.

Zhu Z., "High Performance CMOS Digital Circuit Design," Dissertation, May 1998, 142 pages.

Invitation to Pay Additional Fees and Partial Search Report for PCT/US2016/016096, dated Apr. 26, 2016, 8 pages.

International Search Report and Written Opinion for PCT/US2016/016096, dated Nov. 16, 2016, 20 pages.

Second Written Opinion for PCT/US2016/016096, dated Mar. 13, 2017, 7 pages.

International Preliminary Report on Patentability for PCT/US2016/016096, dated Jun. 16, 2017, 23 pages.

* cited by examiner

P-TYPE FIELD-EFFECT TRANSISTOR (PFET)-BASED SENSE AMPLIFIERS FOR READING PFET PASS-GATE MEMORY BIT CELLS, AND RELATED MEMORY SYSTEMS AND METHODS

PRIORITY APPLICATION

The present application claims priority under 35 U.S.C. § 119(e) to U.S. Provisional Patent Application Ser. No. 62/119,767 filed on Feb. 23, 2015 and entitled "P-TYPE FIELD-EFFECT TRANSISTOR (PFET)-BASED SENSE AMPLIFIERS FOR READING PFET PASS-GATE MEMORY BIT CELLS, AND RELATED MEMORY SYSTEMS AND METHODS," which is incorporated herein by reference in its entirety.

BACKGROUND

I. Field of the Disclosure

The technology of the disclosure relates generally to memory systems employing addressable static memory bit cells for reading and writing data, and more particularly to read assist circuits for mitigating read disturb conditions when reading from bit cells.

II. Background

Supply voltage (i.e., Vdd) scaling is an effective technique for maximizing processor energy efficiency across all market segments, ranging from small, embedded cores in a system-on-a-chip (SoC) to large multicore servers. As supply voltage in processor-based systems is reduced to conserve power, circuit delay sensitivity to parameter variations amplifies, eventually resulting in circuit failures. These circuit failures limit the minimum operating supply voltage and the maximum energy efficiency of processor-based systems. In current processor-based system designs, static random-access memory (SRAM) caches and/or register files limit the minimum operation supply voltage. SRAM cache and register file bit cells employ near minimum-sized transistors to maximize capacity. Since uncorrelated parameter variations (e.g., random-dopant fluctuations, line-edge roughness) are inversely proportional to the square-root of the transistor gate area, wide differences exist for the memory bit cell minimum operating voltage to read, write, and retain data.

In this regard, FIG. 1 is a schematic diagram of an exemplary SRAM system 100 employing memory bit cells 102(0)(0)-102(M)(N) ("bit cells 102(0)(0)-102(M)(N)") for storing data in a data array 104. The data array 104 is organized as having 'N+1' bit cell columns and 'M+1' bit cell rows of bit cells 102 supporting an 'N+1' bit wide data word. A bit line driver 112(0)-112(N) is provided for each bit cell column 0-N to drive a selected bit line 114(0)-114(N) and a complement bit line (bit line_b) 114'(0)-114'(N) for read and write operations. A wordline driver 108(0)-108(M) is provided for each bit cell row 0-M in the data array 104 to control access to the addressed bit cells 102( )(0)-102( )(N) in a given bit cell row 0-M based on an index(0)-index(M) decoded from a memory address indicating the bit cell row 0-M to be selected. A clock signal (clk) 110 controls the timing of asserting the activated wordline 106(0)-106(M) to access a row of bit cells 102( )(0)-102( )(N) in the selected bit cell row 0-M. The wordline driver 108(0)-108(M) for the selected bit cell row 0-M causes the data stored in the selected bit cells 102( )(0)-102( )(N) to be asserted onto the bit lines 114(0)-114(N) and complement bit lines 114'(0)-114'(N) to be sensed by sense amplifiers 116(0)-116(N) provided in each bit cell column 0-N. The sense amplifiers 116(0)-116(N) provide the data bits from the selected bit cells 102( )(0)-102( )(N) onto respective data output lines 118(0)-118(N).

FIG. 2 is a circuit diagram of a bit cell 102 in the SRAM system 100 in FIG. 1. In this example, the bit cell 102 is a standard six (6) transistor (6-T) static complement memory bit cell. The bit cell 102 comprises two (2) cross-coupled inverters 120(0), 120(1) powered by voltage Vdd. The cross-coupled inverters 120(0), 120(1) reinforce each other to retain data in the form of a voltage on a respective true node (T) 122 and a complement node (C) 122'. Each inverter 120(0), 120(1) is comprised of a respective pull-up P-type Field-effect Transistor (PFET) 124(0), 124(1) coupled in series to a respective pull-down N-type Field-effect Transistor (NFET) 126(0), 126(1). NFET access transistors 128(0), 128(1) are coupled to the respective inverters 120(0), 120(1) to provide respective read/write ports 130(0), 130(1) to the bit cell 102. In a read operation, the bit line 114 and complement bit line 114' are pre-charged to voltage Vdd. Then, the wordline 106 coupled to gates (G) of the NFET access transistors 128(0), 128(1) is asserted to evaluate the differential voltages on the true node 122 and complement node 122' to read the bit cell 102. If a logic high voltage level (i.e., a '1') is stored at the true node 122 (T=1) and a logic low voltage level (i.e., '0') is stored at the complement node 122' (C=0), assertion of the wordline 106 will cause the NFET access transistor 128(1) to discharge the pre-charged voltage on the complement bit line 114' to the complement node 122' and through the NFET 126(1) to ground. However, if the NFET access transistor 128(1) is a faster device than the PFET 124(1), the discharge of the pre-charged voltage on the complement bit line 114' can cause a charge build up on complement node 122' that can cause inverter 120(0) to flip the voltage on the true node 122 from a logic '1' to a logic '0', which may cause a subsequent read operation to the bit cell 102 to return erroneous data. This is known as a read disturb condition.

To mitigate or avoid a read disturb condition from occurring in the bit cell 102 in FIG. 2, the NFET access transistors 128(0), 128(1) could be weakened and the PFETs 124(0), 124(1) in the inverters 120(0), 120(1) be strengthened. However, this can cause write contention issues in the bit cell 102. FIG. 3 is a circuit diagram illustrating a write contention between the NFET access transistor 128(0) and the PFET 124(0) in the inverter 120(0) in the bit cell 102 in FIG. 2. For example, during a write operation, if a logic '1' is stored in the true node 122 (T=1) (and a logic '0' is stored in the complement node 122' (C-0)) and the data placed on the bit line 114 to be written to the true node 122 is a logic '0', the NFET access transistor 128(0) couples the true node 122 to the bit line 114 to write a logic '0' to the true node 122. The NFET access transistor 128(0) is capable of passing a strong logic '0'. However, the logic '0' stored in the complement node 122' can cause the strengthened PFET 124(0) to overcome the drive strength of the NFET access transistor 128(0) to charge the true node 122 to voltage Vdd (i.e., a logic '1'), thus causing a write contention on the true node 122.

SUMMARY OF THE DISCLOSURE

Aspects of the disclosure involve P-type Field-effect Transistor (PFET)-based sense amplifiers for reading PFET pass-gate memory bit cells ("bit cells"). Related methods and systems are also disclosed. The bit cells are provided in a data array of a memory system in a processor-based system to store data. Sense amplifiers are provided in the memory system to sense the bit line voltage(s) of the bit cells to read the data stored in the bit cells. It has been observed that as node technology is scaled down in size, PFET drive current (i.e., drive strength) exceeds N-type Field-effect Transistor (NFET) drive current for like-dimensioned FETs. A sense amplifier is a performance critical element in a memory system for read operations. In this regard, in one aspect, it is desired to provide PFET-based sense amplifiers to increase memory read times to the bit cells, and thus improve memory read performance.

In this regard, in one exemplary aspect, a memory system is provided. The memory system comprises a memory bit cell. The memory bit cell comprises a storage circuit configured to store data. The memory bit cell also comprises one or more PFET access transistors configured to pass the stored data from the storage circuit to a respective bit line among one or more bit lines in response to a read operation. The memory system also comprises a sense amplifier. The sense amplifier comprises one or more PFET sense transistors each configured to sense the data on a respective bit line among the one or more bit lines in response to the read operation.

In another exemplary aspect, a memory system is provided. The memory system comprises a means for storing data comprising one or more PFET access transistors. The one or more PFET access transistors are configured to pass the data from the means for storing the data to a respective bit line among one or more bit lines in response to a read operation. The memory system also comprises a means for sensing the data on the one or more bit lines. The means for sensing the data comprises one or more PFET sense transistors for sensing the data on a respective bit line among the one or more bit lines in response to the read operation.

In another exemplary aspect, a method of sensing data from a memory bit cell is provided. The method comprises pre-discharging one or more bit lines each coupled to an access node of a PFET access transistor among one or more PFET access transistors in a memory bit cell in response to a read operation. The method also comprises activating a wordline coupled to a gate of the one or more PFET access transistors in response to the read operation to transfer data stored in a storage circuit to the access node and the one or more bit lines. The method also comprises sensing the data on a respective bit line among the one or more bit lines in one or more PFET sense transistors each coupled to the respective bit line in response to the read operation.

In another exemplary aspect, a non-transitory computer-readable medium having stored thereon computer data for an integrated circuit (IC) is provided. The IC comprises a memory system. The memory system comprises a memory bit cell. The memory bit cell comprises a storage circuit configured to store data. The memory bit cell also comprises one or more PFET access transistors configured to pass the stored data from the storage circuit to a respective bit line among one or more bit lines in response to a read operation. The memory system also comprises a sense amplifier. The sense amplifier comprises one or more PFET sense transistors each configured to sense the data on a respective bit line among the one or more bit lines in response to the read operation.

DETAILED DESCRIPTION

Figure 1:
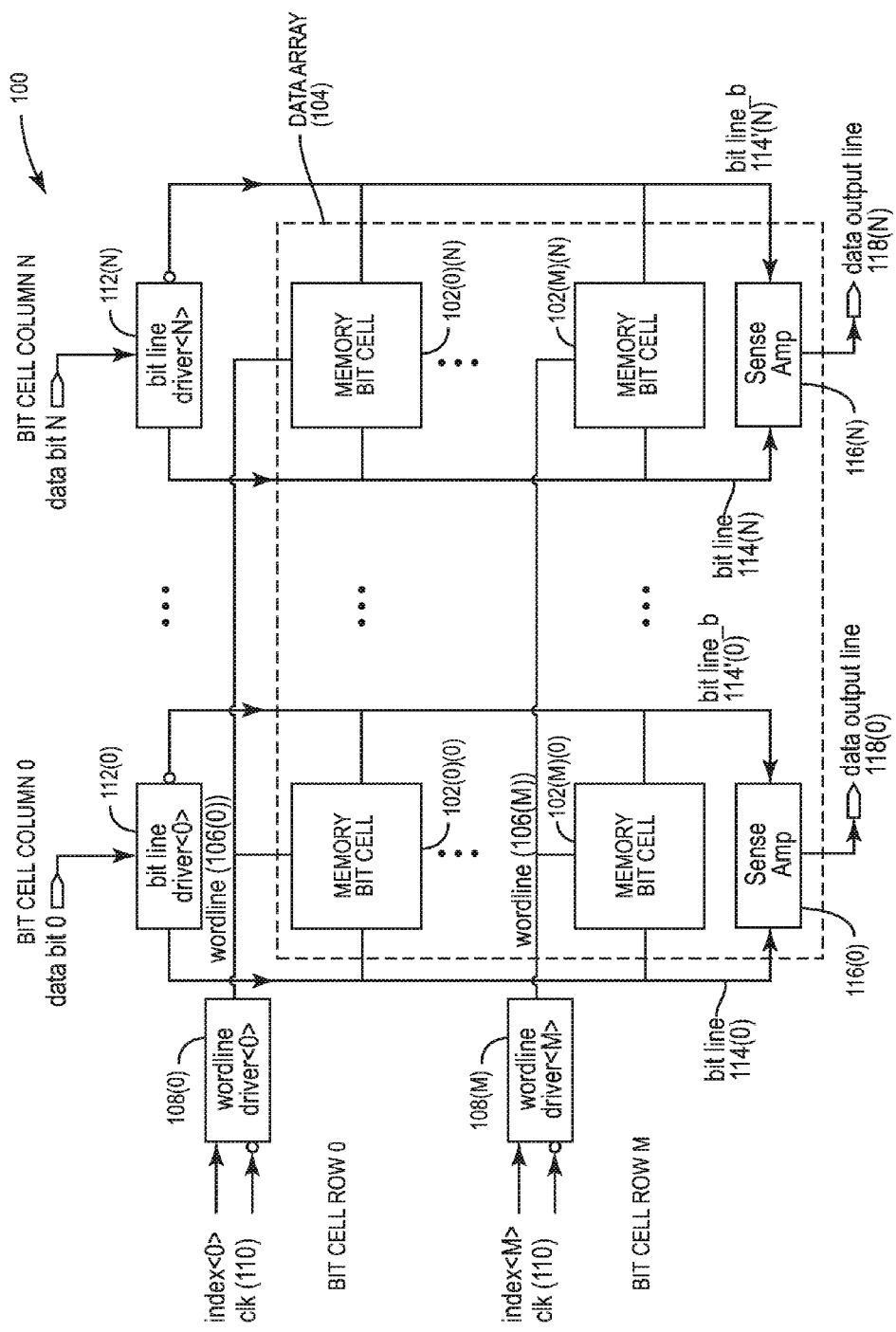
FIG. 1 is a schematic diagram of an exemplary processor-based memory system employing a static random access memory (SRAM) system comprising a data array of static memory bit cells organized in rows and columns for storing data.
Figure 2:
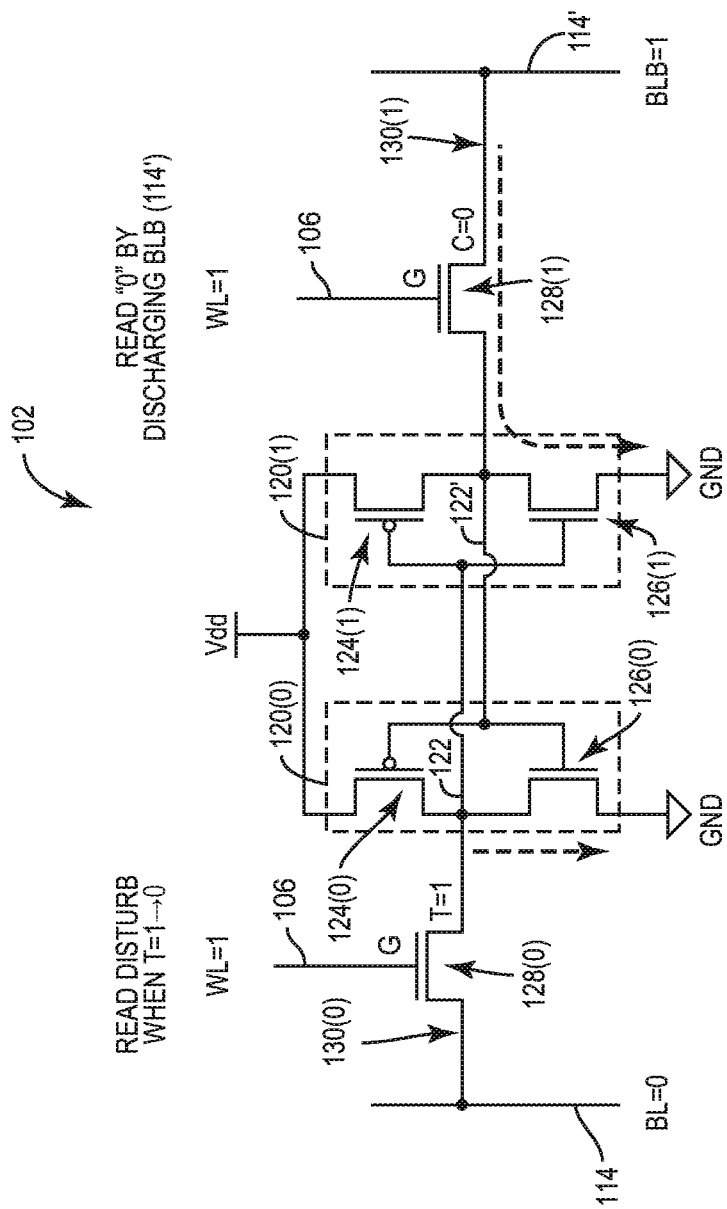
FIG. 2 is a circuit diagram illustrating a read disturb condition in a standard six (6) transistor (6-T) static complement memory bit cell that can be employed in the data array in the SRAM system in FIG. 1.
Figure 3:
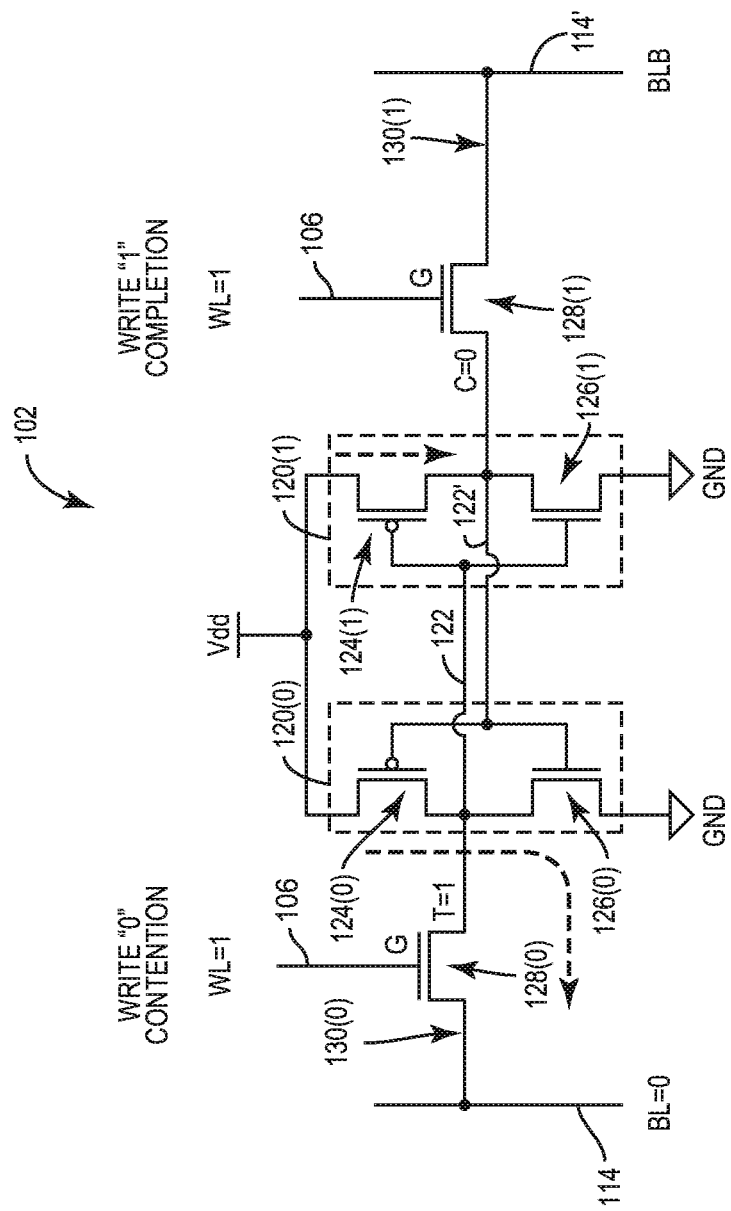
FIG. 3 is a circuit diagram illustrating a write contention between an N-type Field-effect Transistor (NFET) access transistor and an inverter P-type Field-effect Transistor (PFET) in a standard 6-T static complement memory bit cell that can be employed in the data array in the SRAM system in FIG. 1.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 4:
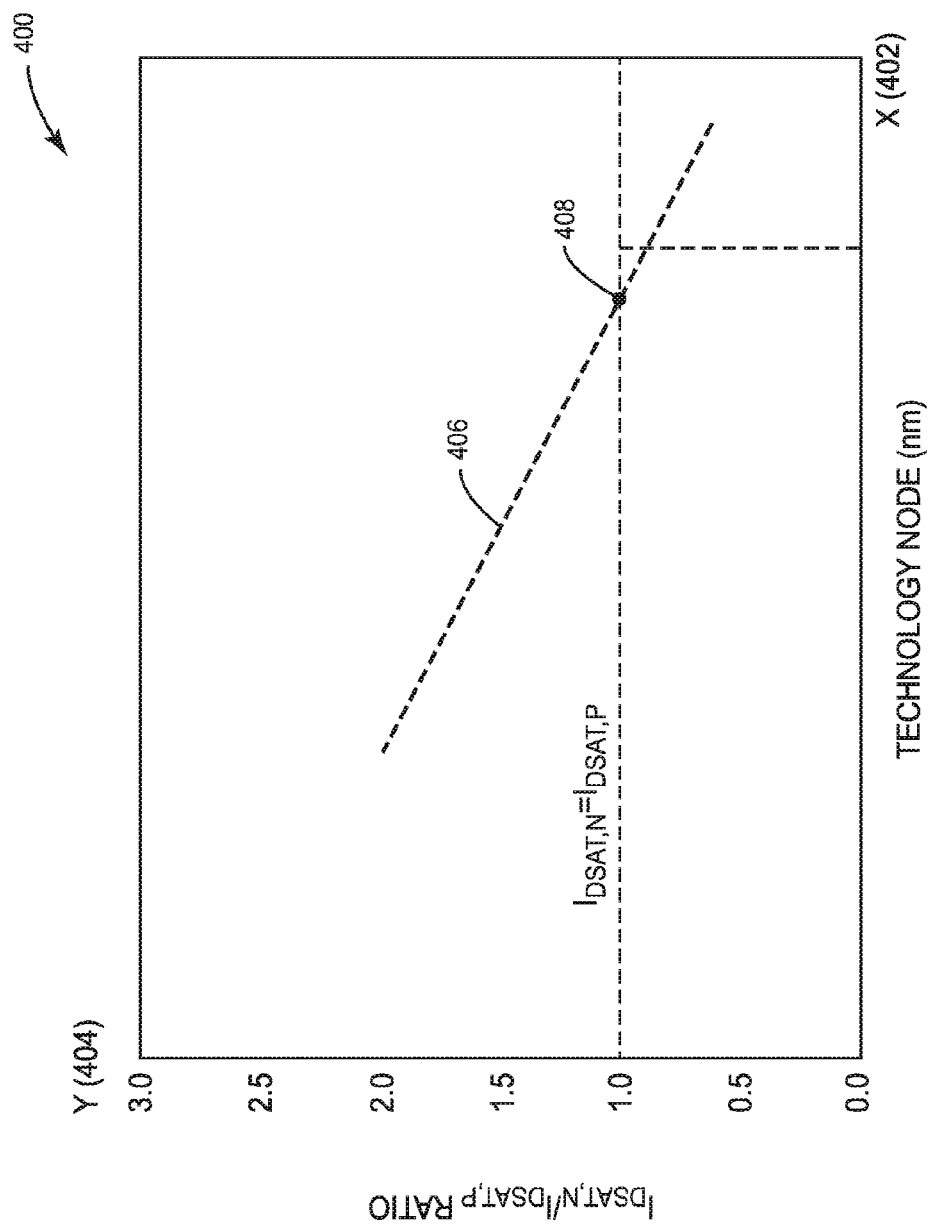
FIG. 4 is a graph illustrating relative saturation drain currents ($I_{DSAT}$) of NFET and PFET technology as a function of technology node size.

Memory bit cells are provided in a data array of a memory system in a processor-based system to store data. As shown in a graph 400 in FIG. 4, it has been observed that as node technology is scaled down in size, P-type field effect transistor (PFET) drive current (i.e., drive strength) exceeds N-type Field-effect Transistor (NFET) drive current for like-dimensioned FETs. This is due to the introduction of strained silicon in FET fabrication to reduce the effective mass of charge carriers. As illustrated in FIG. 4, the technology node size in nanometers (nm) is provided on an X-axis 402. The ratio of a saturation drain current ($I_{DSAT,N}$) of an NFET to the saturation drain current of a PFET ($I_{DSAT,N}/I_{DSAT,P}$) is provided on a Y-axis 404. The ratio of $I_{DSAT,N}$ to $I_{DSAT,P}$ as a function of technology node size in nm is shown on a ratio line 406. As shown by the ratio line 406 in FIG. 4, a PFET drive strength increases as compared to a like-dimensioned NFET as the technology node size decreases. At point 408, the ratio line 406 crosses a ratio of 1.0 of NFET drive strength to PFET drive strength. Thus, in this example, the drive strength of the PFET is greater than the drive strength of a like-dimensioned NFET.

In this regard, as discussed in more detail below, aspects disclosed herein involve PFET-based sense amplifiers that can be employed to sense memory bit cells, including but not limited to memory bit ells employing PFET read port(s). A sense amplifier may be a performance critical element in a memory bit cell. The speed of a sense amplifier affects overall read access times to a memory. In this regard, in one aspect, examples of which are discussed below in more detail, PFET-based sense amplifiers may be provided in a memory system to increase memory read times to the bit cells, and thus improve memory read performance. As shown in the saturation drive current ($I_{DSAT}$) equation below, an increase in the charge carrier effective mobility results in an increase in drive current ($I_D$).

$$I_D = \tfrac{1}{2}\mu C_{ox} W/L (V_{GS}-V_{TH})^2$$

where:
'µ' is the charge carrier effective mobility,
'W' is the gate width,
'L' is the gate length,
'$C_{ox}$' is the capacitance of the oxide layer;
'$V_{GS}$' is the gate to source voltage, and
'$V_{TH}$' is the threshold voltage.

Figure 5A:
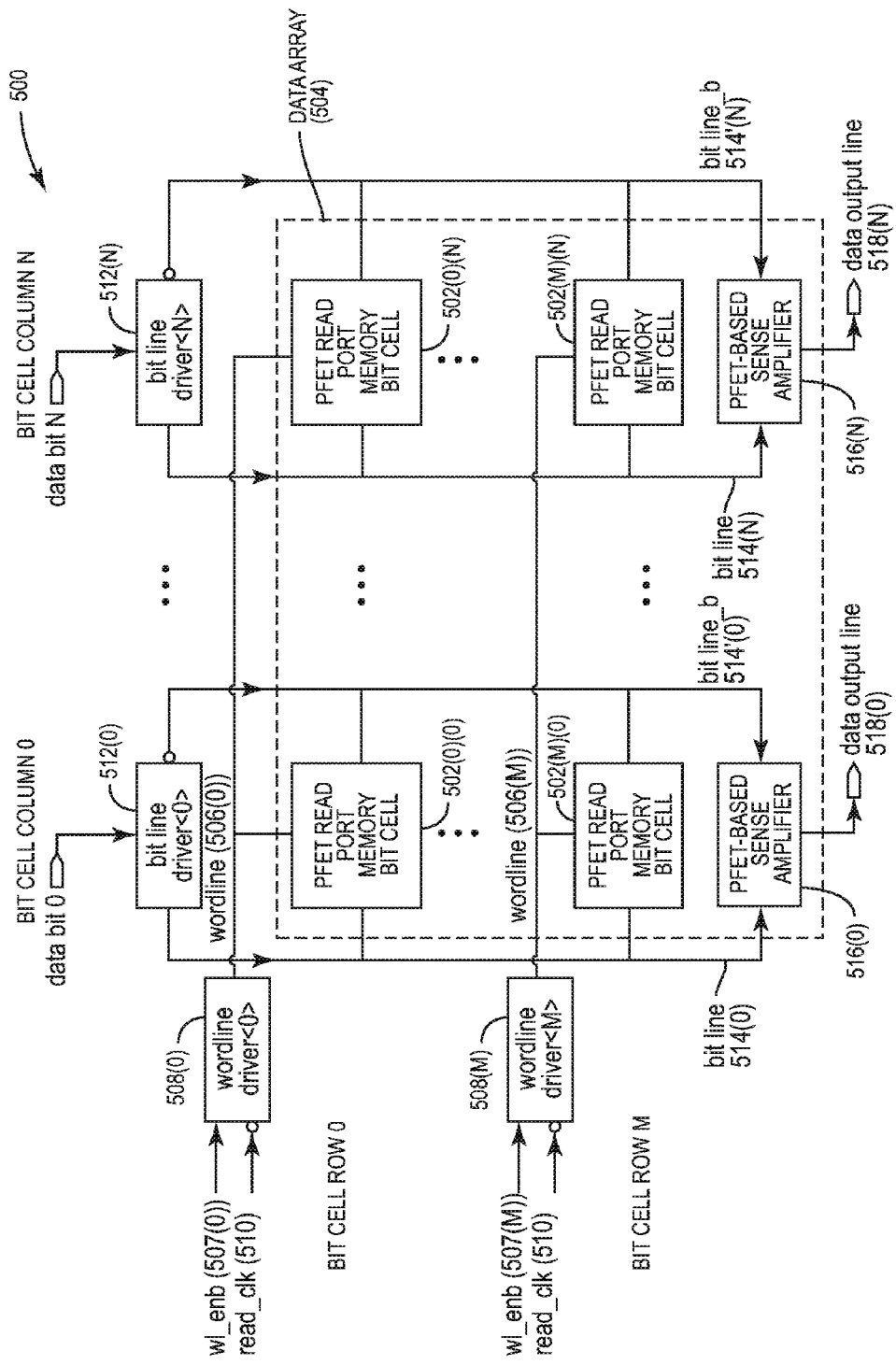
FIG. 5A is a schematic diagram of an exemplary processor-based memory system employing a memory system comprising a data array of static memory bit cells employing a PFET read port.

In this regard, FIG. 5A is a schematic diagram of an exemplary memory system 500 employing PFET read port memory bit cells 502(0)(0)-502(M)(N) (also referred to herein as "memory bit cells 502(0)(0)-502(M)(N)"). PFET read port memory bit cells 502 are memory bit cells that each have one or more PFET read ports. As discussed above, if the technology node of the memory bit cells 502(0)(0)-502(M)(N) is scaled down far enough, the memory bit cells 502(0)(0)-502(M)(N) will perform read operations faster than similar memory bit cells employing NFET read ports. The memory bit cells 502(0)(0)-502(M)(N) are configured to store data in a data array 504. As a non-limiting example, the memory bit cells 502(0)(0)-502(M)(N) may be standard six (6) transistor (6-T) or eight (8) transistor (8-T) static complement memory bit cells. The data array 504 is organized as having 'N+1' bit cell columns and 'M+1' bit cell rows of memory bit cells 502 supporting an 'N+1' bit wide data word. For any given bit cell row 0-M in the data array 504, each bit cell column 0-N of the data array 504 includes a memory bit cell 502 in which a single data value or bit is stored.

With continuing reference to FIG. 5A, read operations to the memory bit cells 502(0)(0)-502(M)(N) are controlled by respective wordlines 506(0)-506(M) corresponding to each bit cell row 0-M. A read operation is performed on the memory bit cells 502( )(0)-502( )(N) in a given bit cell row 0-M based on a wordline enable signal (wl_enb) 507(0)-507(M) generated as a result of decoding a memory address in a memory read operation indicating the bit cell row 0-M to be read. A wordline driver 508(0)-508(M) is provided for each bit cell row 0-M in the data array 504 to control reading from the addressed memory bit cells 502( )(0)-502( )(N) in a given bit cell row 0-M based on the received respective wordline enable signal (wl_enb) 507(0)-507(M). Thus, only one wordline driver 508(0)-508(M) is activated at a time in this example. A read clock signal (read_clk) 510 controls the timing of asserting the activated wordline (WL) 506(0)-506(M) to read the memory bit cells 502( )(0)-502(0)(N) in the selected bit cell row 0-M.

With continuing reference to FIG. 5A, a bit line driver 512(0)-512(N) is provided for each bit cell column 0-N in the memory system 500 for reading data from memory bit cells 502( )(0)-502( )(N) in the selected bit cell row 0-M. In this regard, the bit line drivers 512(0)-512(N) drive a bit line 514(0)-514(N) and a complement bit line (bit line_b) 514'(0)-514'(N), because the memory bit cells 502(0)(0)-502(M)(N) employ a complement bit line architecture.

In a write operation, data bits 0-N to be written are provided to respective bit line drivers 512(0)-512(N) to drive the received data bits 0-N and their complement data bits onto the bit lines 514(0)-514(N) and complement bit lines 514'(0)-514'(N), respectively. The wordline driver 508(0)-508(M) for the selected bit cell row 0-M is activated to select the memory bit cells 502( )(0)-502( )(N) to be written. The data bits 0-N asserted on the bit lines 514(0)-514(N) and complement bit lines 514'(0)-514'(N), respectively, are written into the selected memory bit cells 502( )(0)-502( )(N).

In a read operation, the bit line drivers 512(0)-512(N) pre-discharge the bit lines 514(0)-514(N) and complement bit lines 514'(0)-514'(N) during a pre-discharge stage. The wordline driver 508(0)-508(M) for the selected bit cell row 0-M causes the data stored in the selected memory bit cells 502( )(0)-502( )(N) to be asserted onto the bit lines 514(0)-514(N) and complement bit lines 514'(0)-514'(N) to be sensed by sense amplifiers 516(0)-516(N) provided in each bit cell column 0-N. The sense amplifiers 516(0)-516(N) provide the data bits from the selected memory bit cells 502( )(0)-502( )(N) onto respective data output lines 518(0)-518(N).

Figure 5B:
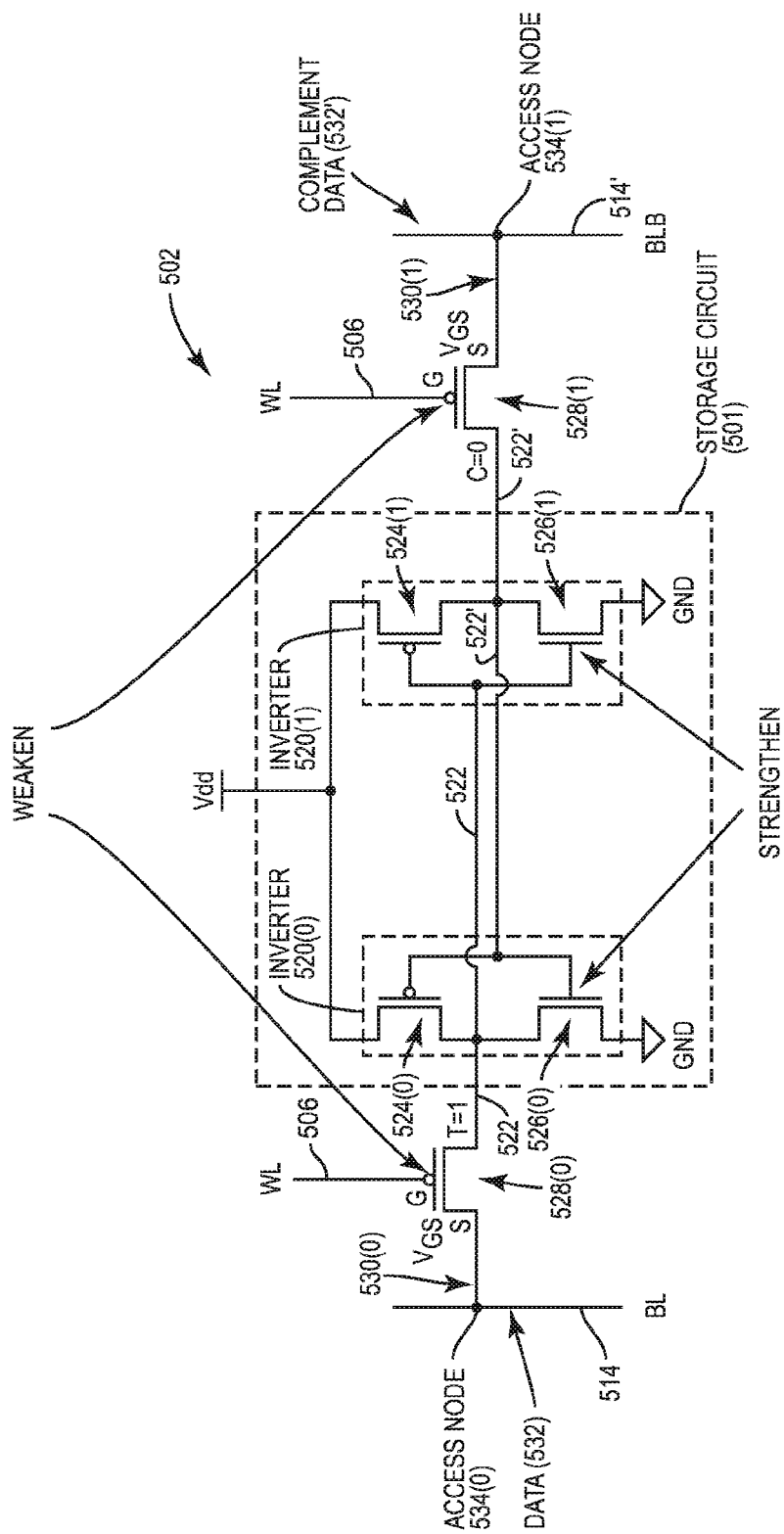
FIG. 5B is a circuit diagram illustrating an exemplary mitigation of a read disturb condition in a standard 6-T static complement memory bit cell employing a PFET read port in the data array in the memory system in FIG. 5A.
Figure 5C:
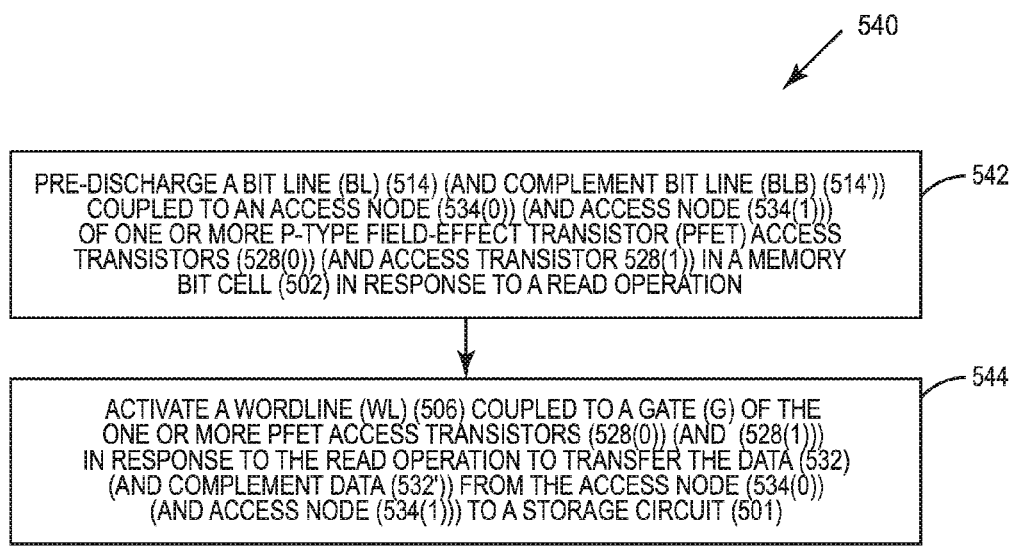
FIG. 5C is a flowchart illustrating exemplary processes of reading the memory bit cell in FIG. 5B in response to a read operation.

FIG. 5B is a circuit diagram illustrating how to mitigate or avoid a read disturb condition in a PFET read port memory bit cell 502 employing a PFET read/write port in the data array 504 in the memory system 500 in FIG. 5A. FIG. 5C is a flowchart illustrating an exemplary process 540 for reading the PFET read port memory bit cell 502 in response to a read operation. The process 540 in FIG. 5C will be discussed in conjunction with FIG. 5B.

With reference to FIG. 5B, the PFET read port memory bit cell 502 comprises a storage circuit 501 in this example comprised of two (2) cross-coupled inverters 520(0), 520(1) powered by voltage Vdd. A true storage node (T) 522 and a complement storage node (C) 522' retain data 532 (i.e., a charge) and complement data 532' (i.e., a complement charge to the data 532), respectively, in the form of voltages on the respective true storage node (T) 522 and a complement storage node (C) 522'. Each inverter 520(0), 520(1) is comprised of a respective pull-up PFET 524(0), 524(1) coupled in series to a respective pull-down NFET 526(0), 526(1). Instead of providing NFET access transistors, PFET access transistors 528(0), 528(1) are coupled to the respective inverters 520(0), 520(1) to provide respective PFET read ports 530(0), 530(1) to the PFET read port memory bit cell 502.

In this regard, in a read operation, the bit line 514 and complement bit line 514' are pre-discharged to a low voltage (e.g., GND voltage) (block 542 in FIG. 5C). Then, the wordline (WL) 506 coupled to gates (G) of the PFET access transistors 528(0), 528(1) is activated or asserted to allow a differential voltage to develop between the bit line 514 and the complement bit line 514' in order for the sense amplifier 516(0)-516(N) to determine the state of the data 532 and complement data 532' stored in the storage circuit 501 of the memory bit cell 502 (block 544 in FIG. 5C). For example, FIG. 5B illustrates a logic high voltage level (i.e., a '1') is stored at the true storage node 522 (T=1) and a logic low voltage level (i.e., '0') stored at complement storage node 522' (C=0). The pull-up PFET 524(0) maintains the charge on the true storage node 522. Assertion of a low voltage (e.g., GND voltage) on the wordline (WL) 506 to read the memory bit cell 502 will cause the PFET access transistor 528(0) to charge the voltage of the data 532 on the true storage node 522 through an access node 534(0) of the PFET access transistor 528(0) and onto the bit line 514 (i.e., charge the bit line 514). Similarly, assertion of a low voltage (e.g., GND voltage) on the wordline (WL) 506 to read the memory bit cell 502 will not charge the complement bit line 514' since the voltage on the complement bit line 514' was pre-discharged to a low voltage (e.g., GND voltage) and the voltage at the complement storage node (C) 522' is also the low voltage.

However, if the pull-up PFET 524(0) has a weak drive strength device and is thus a slower device relative to a similarly sized NFET, as the bit line 514 is being charged by the PFET access transistor 528(0), the pull-up PFET 524(0) may not have enough drive strength to quickly re-charge the true storage node 522 as the voltage of the data 532 at the true storage node 522 is coupled to the bit line 514. This loss of charge at the true storage node 522 can cause inverter 520(1) to flip the voltage on the complement storage node 522' from a logic '0' to a logic '1', which may cause a subsequent read operation to the memory bit cell 502 to return erroneous data. This is known as a read disturb condition. This read disturb condition can limit the minimum supply voltage for reading the memory bit cell 502 employing PFET read ports 530(0), 530(1).

PFET-based sense amplifiers can also be provided as the sense amplifiers 516(0)-516(N) in the memory system 500 in FIG. 5A for sensing the bit lines 514(0)-514(N) and the complement bit lines 514'(0)-514'(N) of PFET pass-gate memory bit cells during read operations. As discussed above with regard to FIG. 4, it has been observed that as node technology is scaled down in size, PFET drive current (i.e., drive strength) exceeds N-type Field-effect Transistor (NFET) drive current due for like-dimensioned FETs. This is due to the introduction of strained silicon in FET fabrication to reduce the effective mass of charge carriers. The sense amplifiers 516(0)-516(N) in the memory system 500 in FIG. 5A may be performance critical elements for read operations, because the sensing function performed by the sense amplifiers 516(0)-516(N) is part of the overall read access times to the memory system 500. Thus, it may be desired to provide the sense amplifiers 516(0)-516(N) in the memory system 500 in FIG. 5A as PFET-based sense amplifiers, to reduce memory read times from the memory bit cells 502(0)(0)-502(M)(N), and thus improve memory read performance.

Figure 6:
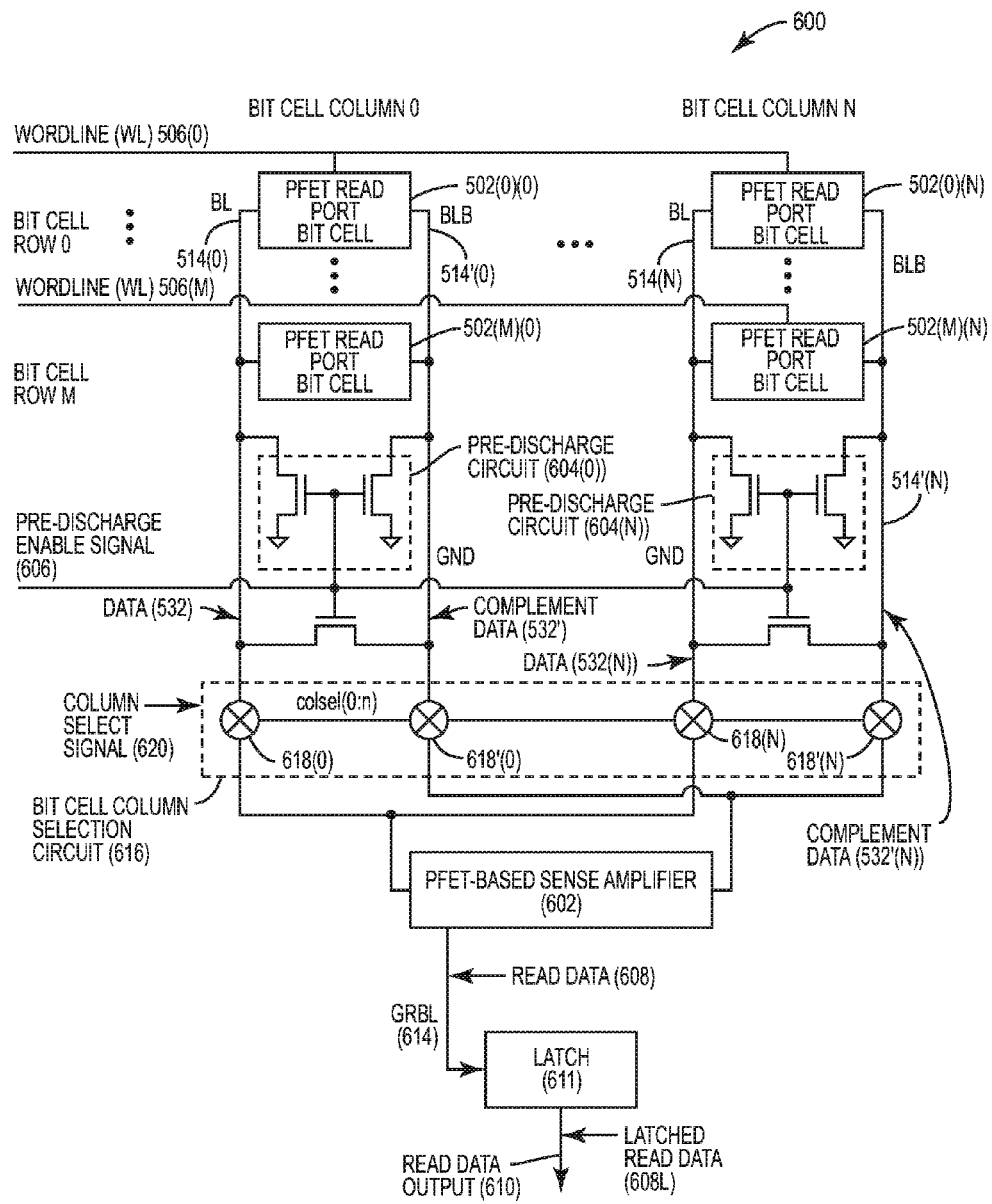
FIG. 6 is a schematic diagram of an exemplary memory system comprising a data array of static memory bit cells employing a PFET read port and a PFET-based sense amplifier.
Figure 7:
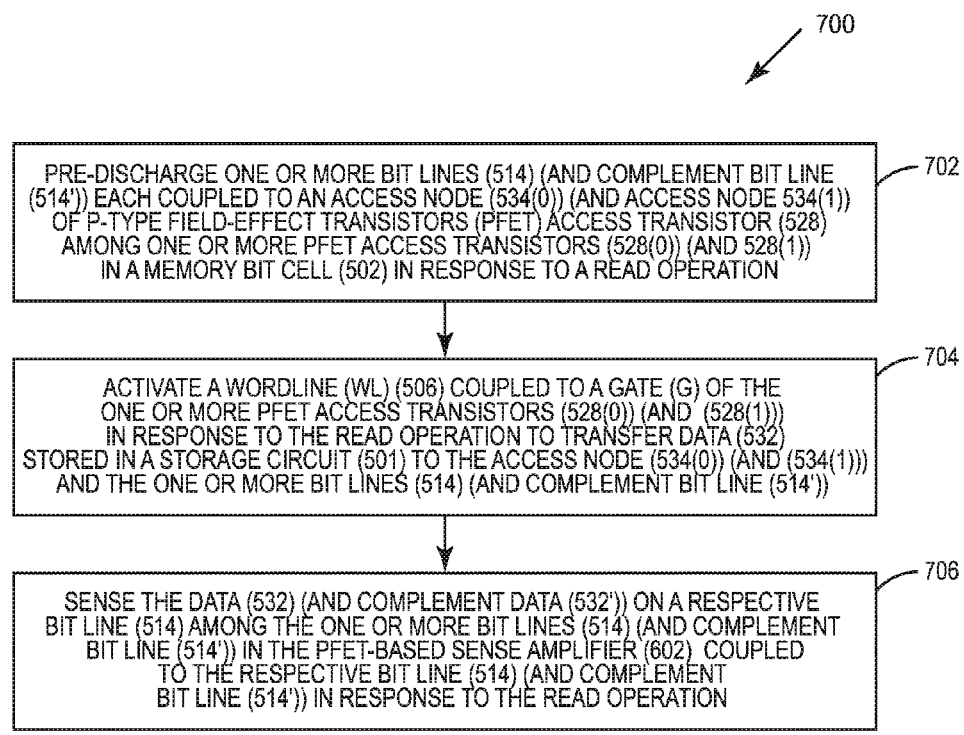
FIG. 7 is a flowchart illustrating an exemplary process of sensing the read ports of PFET-based read port memory bit cells in the memory system in FIG. 6 with a PFET-based sense amplifier.

In this regard, FIG. 6 illustrates an exemplary memory system 600 that is similar to the memory system 500 in FIG. 5A. However, in the memory system 600 in FIG. 6, as will be discussed in more detail below, a PFET-based sense amplifier 602 is provided to sense the bit lines 514(0)-514(N) and the complement bit lines 514'(0)-514'(N) of one or more bit cell columns 0-N of the memory bit cells 502( )(0)-502( )(N) in response to a read operation. Common elements between the memory system 600 in FIG. 6 and the memory system 500 in FIG. 5A are shown with common element numbers between FIGS. 5A-5B and FIG. 6, and thus will not be re-described in FIG. 6. FIG. 7 is a flowchart illustrating an exemplary process 700 of sensing the read ports of PFET-based read port memory bit cells 502(0)(0)-502(M)(N) in the memory system 600 in FIG. 6 employing the PFET-based sense amplifier 602.

With reference to FIG. 6, pre-discharge circuits 604(0)-604(N) are provided for each respective bit cell column 0-N in the memory system 600 in this example. The pre-discharge circuits 604(0)-604(N) are configured to pre-discharge the respective bit line 514(0)-514(N) and respective complement bit line 514'(0)-514'(N) coupled to the PFET-based sense amplifier 602 to a ground voltage node (GND) in this example (block 702 in FIG. 7). In this example, the pre-discharge circuits 604(0)-604(N) are configured to pre-discharge their respective bit line 514(0)-514(N) and respective complement bit line 514'(0)-514'(N) in response to a pre-discharge enable signal 606 indicating a pre-discharge state. In this manner, the bit line 514(0)-514(N) and respective complement bit line 514'(0)-514'(N) are pre-discharged prior to the PFET-based sense amplifier 602 sensing the data on the bit line 514(0)-514(N) and respective complement bit line 514'(0)-514'(N) selected to be coupled to the PFET-based sense amplifier 602 in response to a read operation. The respective bit line 514(0)-514(N) and respective complement bit line 514'(0)-514'(N) for the selected bit cell column 0-N to be read are pre-discharged to the ground node (GND), which is logical '0' in this example. This may allow the minimum supply voltage (Vdd) to be decreased to conserve power in the memory system 600.

With continuing reference to FIG. 6, in response to the read operation, the memory bit cells 502( )(0)-502( )(N) in the selected bit cell row 0-M to be read will be selected to be coupled to the bit line 514(0)-514(N) and respective complement bit line 514'(0)-514'(N). The memory bit cells 502( )(0)-502( )(N) for the selected bit cell row 0-M are selected according to the wordline (WL) 506 indicating the bit cell row 0-M of memory bit cells 502( )(0)-502( )(N) to be read, as previously described (block 704 in FIG. 7). The PFET-based sense amplifier 602 will sense the differential voltage levels on the respective bit line 514(0)-514(N) and respective complement bit line 514'(0)-514'(N) for the bit cell column 0-N to determine the data 532(0)-532(N) and/or the respective complement data 532'(0)-532(N)' from the read memory bit cell 502( )(0)-502( )(N) (block 706 in FIG.

7). The PFET-based sense amplifier 602 is configured to provide read data 608 on a global read bit line (GRBL) 614, to provide the sensed data from a selected memory bit cell 502(0)( )-502(M)( ) in a bit cell row 0-M in a given bit cell column 0-N. The read data 608 is based on the differential sensed voltage level between the data 532(0)-532(N) and/or the respective complement data 532'(0)-532'(N) on the bit line 514(0)-514(N) and respective complement bit line 514'(0)-514'(N). A latch 611 may be provided, such as a flip-flop, to store the read data 608 provided by the PFET-based sense amplifier 602 and provide the read data 608 as latched read data 608L to another system.

With continuing reference to FIG. 6, note that multiple PFET-based sense amplifiers 602 may be provided in the memory system 600, where each PFET-based sense amplifiers 602 is assigned to certain memory bit cell columns 0-N to be able to sense the data 532(0)-532(N) and/or complement data 532'(0)-532'(N) from memory bit cells 502(0)( )-502(M)( ) in the memory bit cell column 0-N. In the memory system 600 in FIG. 6, the PFET-based sense amplifier 602 is configured to be coupled to multiple bit cell columns 0-N to read memory bit cell 502(0)( )-502(M)( ) from the selected memory bit cell column 0-N. This arrangement is provided so that a separate sense amplifier does not have to be employed for every memory bit cell column 0-N, if not desired. The PFET-based sense amplifier 602 is coupled to the desired bit cell column 0-N by being coupled to the bit line 514(0)-514(N) and respective complement bit line 514'(0)-514'(N) for the selected bit cell column 0-N. However, it is possible to provide a PFET-based sense amplifier 602 for each memory bit cell column 0-N of the memory system 600, if desired.

In this regard, as shown in FIG. 6, a bit cell column selection circuit 616 is also provided in the memory system 600 coupled to the PFET-based sense amplifier 602. The column selection circuit 616 includes a plurality of column selectors 618(0)-618(N) and respective complement column selectors 618'(0)-618'(N) coupled to respective bit lines 514(0)-514(N) and respective complement bit lines 514'(0)-514'(N) of the bit cell columns 0-N. In this regard, in response to a column select signal 620, the column selection circuit 616 is configured to selectively couple the PFET-based sense amplifier 602 to a bit line 514(0)-514(N) and respective complement bit line 514'(0)-514'(N) in a bit cell column 0-N in response to a read operation, so that the PFET-based sense amplifier 602 can sense the data 532(0)-532(N) and respective complement data 532'(0)-532'(N) for the selected bit cell column 0-N.

Figure 8:
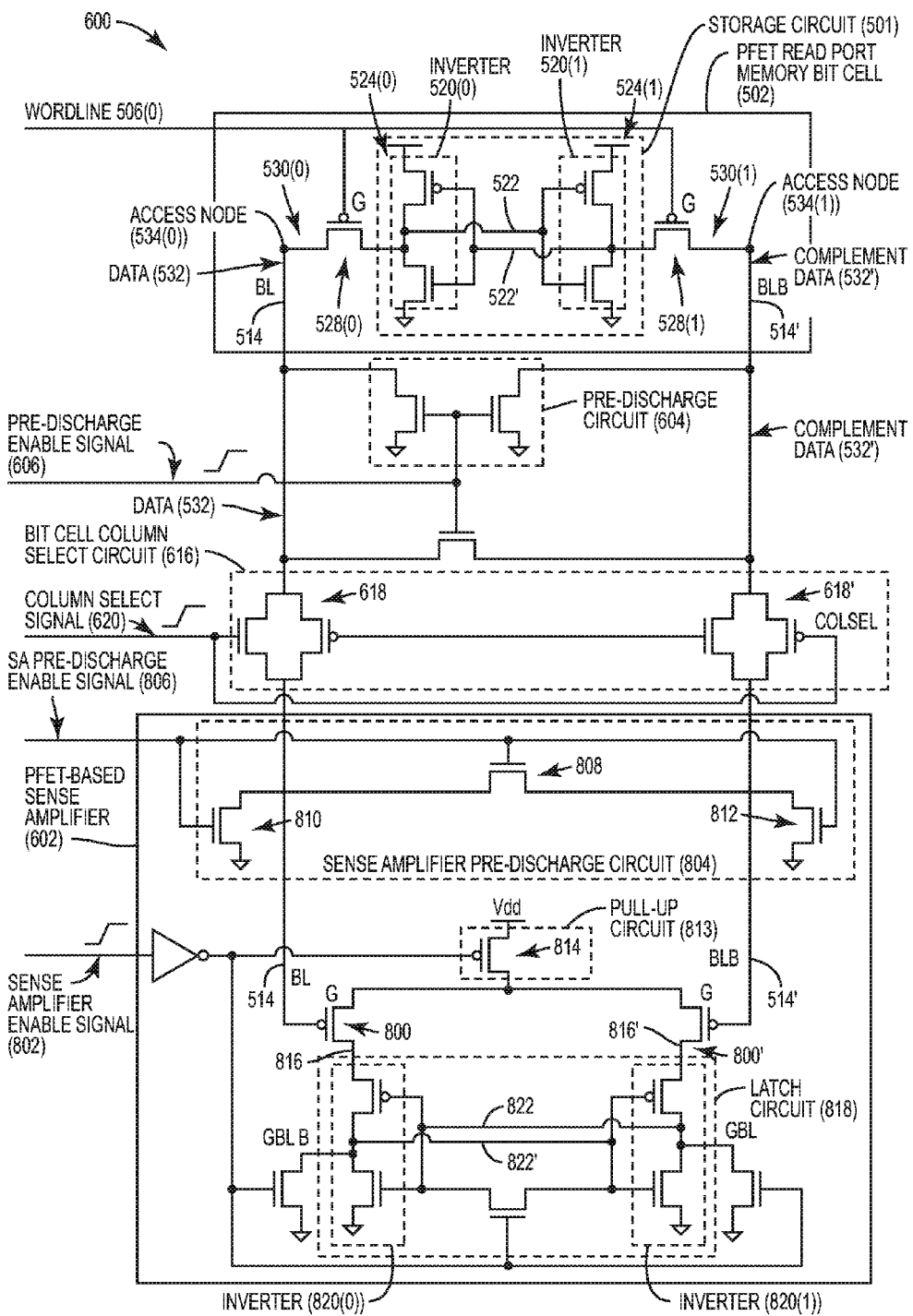
FIG. 8 is a more detailed circuit diagram of the PFET-based sense amplifier in the memory system in FIG. 6 sensing a bit line and a complement bit line of a bit cell column.

It is not required that the PFET-based sense amplifier be provided in a memory system that employs PFET-based memory bit cells with PFET access transistors, such as memory bit cells 502(0)(0)-502(M)(N) in the memory system 600 in FIG. 6. However, it may be desired to provide the PFET-based sense amplifier 602 in the memory system that employs the PFET read port bit cells to provide greater compatibility in sensing the bit lines and the complement bit lines. PFETs are more capable of passing logical '1' values (i.e., higher voltages) than NFETs. For example, FIG. 8 is a more detailed circuit diagram of the PFET-based sense amplifier 602 in the memory system 600 in FIG. 6 configured to sense a bit line 514 and a respective complement bit line 514' of a single selected PFET read port memory bit cell 502 in FIG. 5B. Note however, that as discussed above, the PFET-based sense amplifier 602 can be configured to sense data for memory bit cells 502(0)( )-502(M)( ) in multiple memory bit cell columns 0-N. As previously discussed, the PFET access transistors 528(0), 528(1) in the memory bit cell 502 are configured to pass stored data 532 and complement data 532', respectively, from the storage circuit 501 to a respective bit line 514 and complement bit line 514' in response to a read operation.

As shown in FIG. 8, PFET-based sense amplifier 602 in this example includes a PFET sense transistor 800 and a complement PFET sense transistor 800'. The PFET sense transistor 800 and a complement PFET sense transistor 800' are configured to sense the data 532 and complement data 532', respectively on a respective bit line 514 and respective complement bit line 514' in response to the read operation. Both the PFET sense transistor 800 and the complement PFET sense transistor 800' are provided in the PFET-based sense amplifier 602 in this example, because the memory system 600 employs the bit line 514 and complement bit line 514' architecture to allow for differential data sensing. In this example, the PFET sense transistor 800 and a complement PFET sense transistor 800' are configured to sense the data 532 and complement data 532', respectively, from the memory bit cell 502 in response to a sense amplifier enable signal 802 indicating a sense state in response to the read operation.

While not required, the PFET-based sense amplifier 602 employing the PFET sense transistor 800 and the complement PFET sense transistor 800' may be well suited for use in sensing PFET read port memory bit cells, including the memory bit cell 502 in the memory system 600 in FIG. 8. For example, if the PFET access transistor 528(0), 528(1) of the memory bit cell 502 drives a logical '1' from a respective true storage node 522 or complement storage node 522', to a respective bit line 514 or complement bit line 514', the PFET-based sense amplifier 602 employing the PFET sense transistor 800 and complement PFET sense transistor 800' may be able to better sense the logical '1' passed by the PFET access transistor 528(0), 528(1). This provides for an enhanced differential between a bit line 514 and its respective complement bit line 514' for enhanced differential voltage sensing by the PFET-based sense amplifier 602 during read operations.

With continuing reference to FIG. 8, a sense amplifier pre-discharge circuit 804 provided in the PFET-based sense amplifier 602 is configured to pre-discharge the bit line 514 and complement bit line 514' coupled to the PFET sense transistor 800 and a complement PFET sense transistor 800' in response to a sense amplifier pre-discharge enable signal 806 indicating a pre-discharge state. In this manner, the starting voltage on the bit line 514 and complement bit line 514' is the same before the read operation asserts the data 532 and complement data 532' onto the bit line 514 and complement bit line 514' that will be coupled to the PFET sense transistors 800, 800' in response to read operation. Otherwise, the starting voltages on the bit line 514 and complement bit line 514' may vary based on the capacitance of the bit line 514 and complement bit line 514' due to their length, even with the bit line 514 and complement bit line 514' being pre-discharged by the pre-discharge circuit 604. In this example, the sense amplifier pre-discharge circuit 804 includes a NFET 808 configured to couple pull-down NFETs 810, 812 to the bit line 514 and complement bit line 514' for pre-discharging the bit line 514 and complement bit line 514'. The NFETs 808, 810, 812 are gate activated based on the sense amplifier pre-discharge enable signal 806.

With continuing reference to FIG. 8, assuming that data 532 is a logical '0' and complement data 532' is a logical '1', this data 532 is asserted onto the bit line 514 and complement bit line 514' in response to a read operation. The PFET sense transistor 800 will turn on or be activated in response to the data 532 being a logical '0' and coupled to its gate (G). This will cause pull-up circuit 813, provided in the form of a pull-up PFET 814 in this example, which is activated in response to the sense amplifier enable signal 802 indicating a sense state, to charge pull-up node 816 to voltage (Vdd). The complement PFET sense transistor 800' will not turn on or be activated based on the complement data 532' being logical '1' and coupled to its gate (G). Thus, the voltage at node 816' will not be pulled-up by pull-up PFET 814 to voltage (Vdd). A latch circuit 818 is provided in the PFET-based sense amplifier 602 operates like that of the storage circuit 501 in the memory bit cell 502 in this example. In this regard, the latch circuit 818 comprises two (2) cross-coupled inverters 820(0), 820(1) that are configured generate data based on the sensing of the complement data 532' and complement data 532' by the PFET sense transistors 800, 800'. In this manner, the data 532 and complement data 532' sensed by PFET sense transistors 800, will cause the inverters 820(0), 820(1) to reinforcingly generate and retain data on a true storage node 822 and a complement storage node 822' based on the sensed data from the memory bit cell 502. This retained data can be provided as the data 608 on the data output 610 by the PFET-based sense amplifier 602, as shown in FIG. 6.

The PFET-based sense amplifier 602 described above can also be employed with a read assist circuit(s) configured to mitigate or avoid read disturb conditions during read operations. For example, if the PFET-based sense amplifier 602 is employed to sense data from a PFET read port memory bit cell(s) 502, like shown in the memory system 600 in FIGS. 6 and 8 above, it may be desired to also employ a read assist circuit that is compatible with the PFET read port memory bit cell(s) 502 to mitigate or avoid read disturb conditions during read operations.

However, for example, with reference to FIG. 8, if the pull-up PFET 524(0) in the storage circuit 501 in the memory bit cell 502 has a weak drive strength device and is thus a slower device, as the bit line 514 is being charged by the PFET access transistor 528(0), the pull-up PFET 524(0) may not have enough drive strength to quickly re-charge any lost charge on the true storage node 522 as the voltage of the data 532 at the true storage node 522 is couple to the bit line 514. This loss of charge at the true storage node 522 can cause inverter 520(1) to flip the voltage on the complement storage node 522' from a logic '0' to a logic '1', which may cause a subsequent read operation to the memory bit cell 502 to return erroneous data. This is known as a read disturb condition. This read disturb condition can limit the minimum supply voltage for reading the memory bit cell 502 employing PFET read ports 530(0), 530(1).

To mitigate or avoid a read disturb condition from occurring in the memory bit cell 502, the PFET access transistors 528(0), 528(1) could be weakened to decrease their gate (G)-to-source (S) voltage ($V_{GS}$) voltages and/or the pull-down PFETs 524(0), 524(1) in the inverters 520(0), 520(1) could be strengthened. This is shown in the exemplary process 900 in FIG. 9, which includes the steps of the exemplary process 540 in FIG. 5C to perform a read operation on the memory bit cell 502. In this regard, read-assist circuits can be provided to boost a voltage in the memory bit cell 502 in the memory system 600 in FIG. 8 to assist in transferring data 532 and/or complement data 532' from the storage circuit 501 to the respective bit line 514 and complement bit line 514' (block 902 in FIG. 9). There are different exemplary read-assist circuits disclosed herein that can be provided for the memory bit cell 502 to mitigate or avoid read disturb contentions in response to read operations. In this manner, as technology node of the memory bit cell 502 is scaled down, the benefit of the faster read times in the memory bit cell 502 employing the PFET read ports 530(0), 530(1) can be realized while mitigating or avoiding read disturb conditions. By mitigating or avoiding read disturb conditions in the memory bit cell 502, the voltage supply providing the minimum voltage (Vdd) to the memory bit cell 502 for operation and data retention can be reduced to reduce power consumption in the memory system 600.

Figure 9:
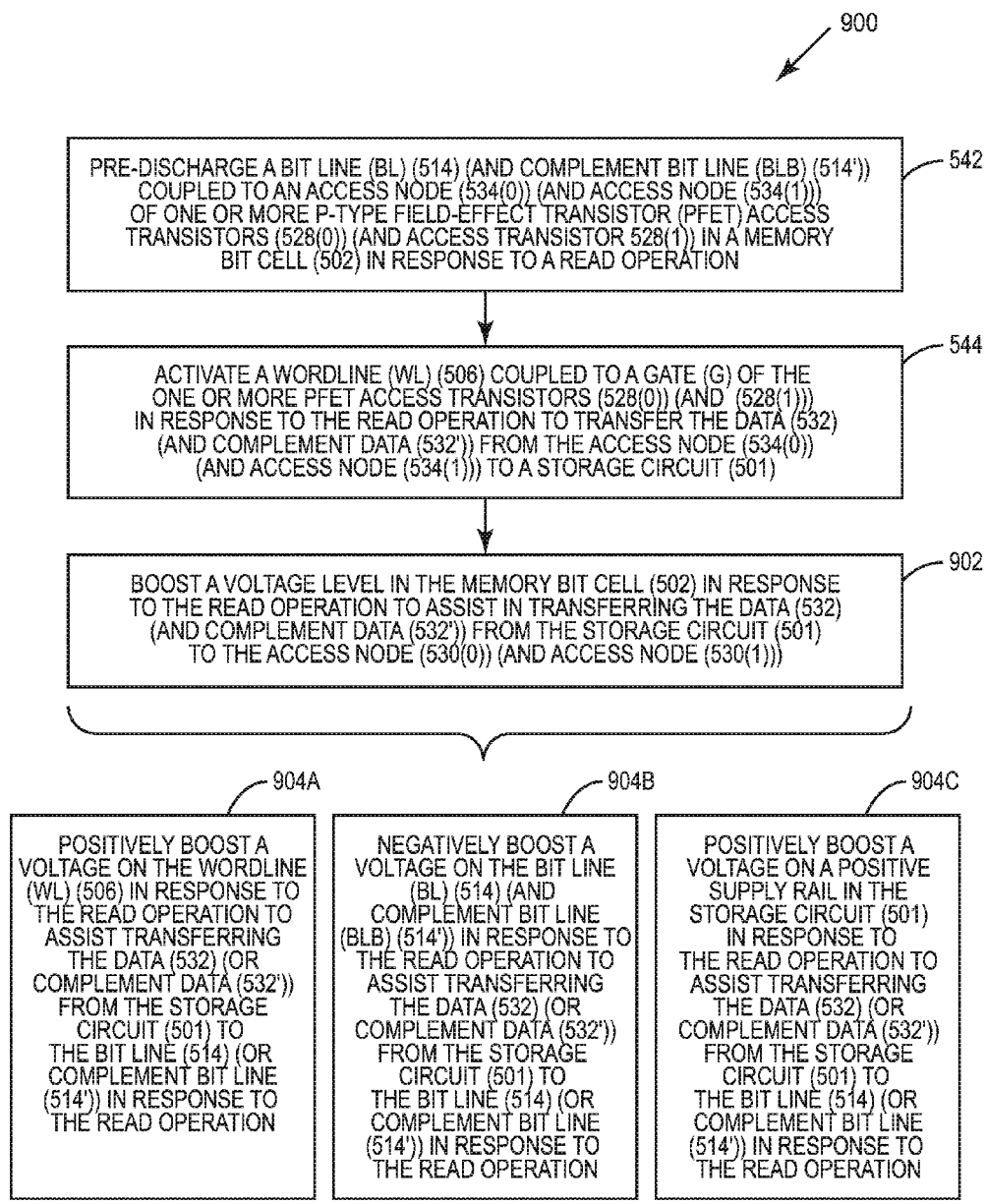
FIG. 9 is a flowchart illustrating exemplary processes of providing read assistance for a memory bit cell including PFET access transistors in FIG. 5B to mitigate or avoid read disturb conditions in the memory bit cell in response to a read operation.

In this regard, as an example to mitigate or avoid read disturb conditions in the PFET read port memory bit cell 502 in the memory system 600 in FIG. 8, a read-assist circuit employing a positive wordline boost circuit configured to positively boost the voltage of the wordline (WL) 506 in response to a read operation on the PFET read port memory bit cell 502 can be employed (block 904A in FIG. 9). An example of a memory system that includes a read-assist circuit employing positive wordline boost circuits for a PFET read port memory bit cell is shown in FIG. 10 discussed below.

Figure 11:
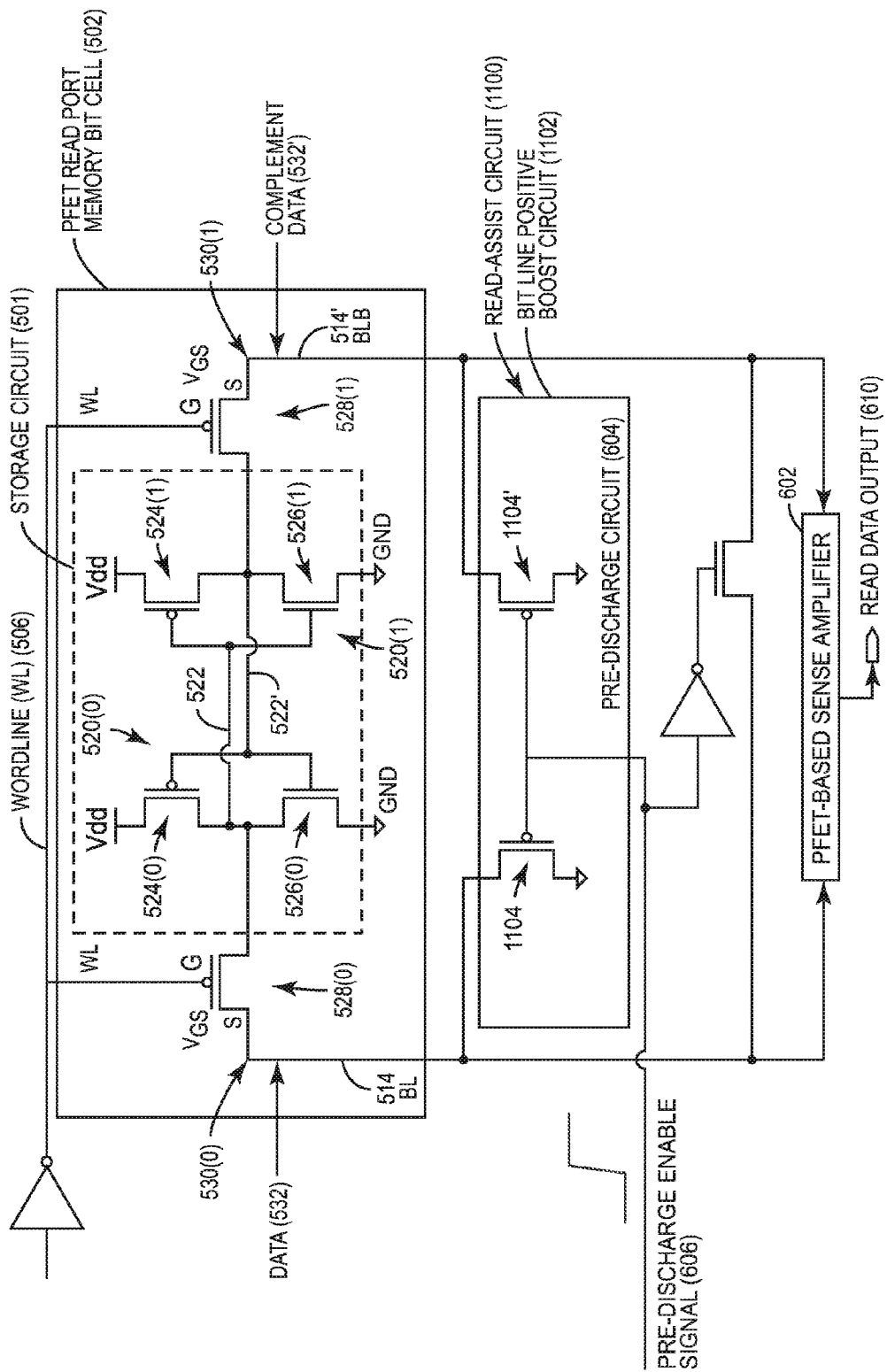
FIG. 11 illustrates an exemplary read-assist circuit that includes an exemplary positive bit line boost circuit provided in a bit line driver to positively boost bit lines of the memory bit cell in FIG. 5B to weaken PFET access transistors in the memory bit cell in response to a read operation to mitigate or avoid a read disturb condition.

Also, as another example to mitigate or avoid read disturb conditions in the PFET read port memory bit cell 502 in the memory system 600 in FIG. 8, a read-assist circuit employing a bit line positive boost circuit can be employed. The bit line positive boost circuit is configured to positively boost the voltage of a bit line coupled to the PFET read port memory bit cell 502 in response to a read operation (block 904B in FIG. 9). An example of a memory system that includes a read-assist circuit employing a bit line positive boost circuit for a PFET read port memory bit cell is shown in FIG. 11 discussed below.

Figure 12:
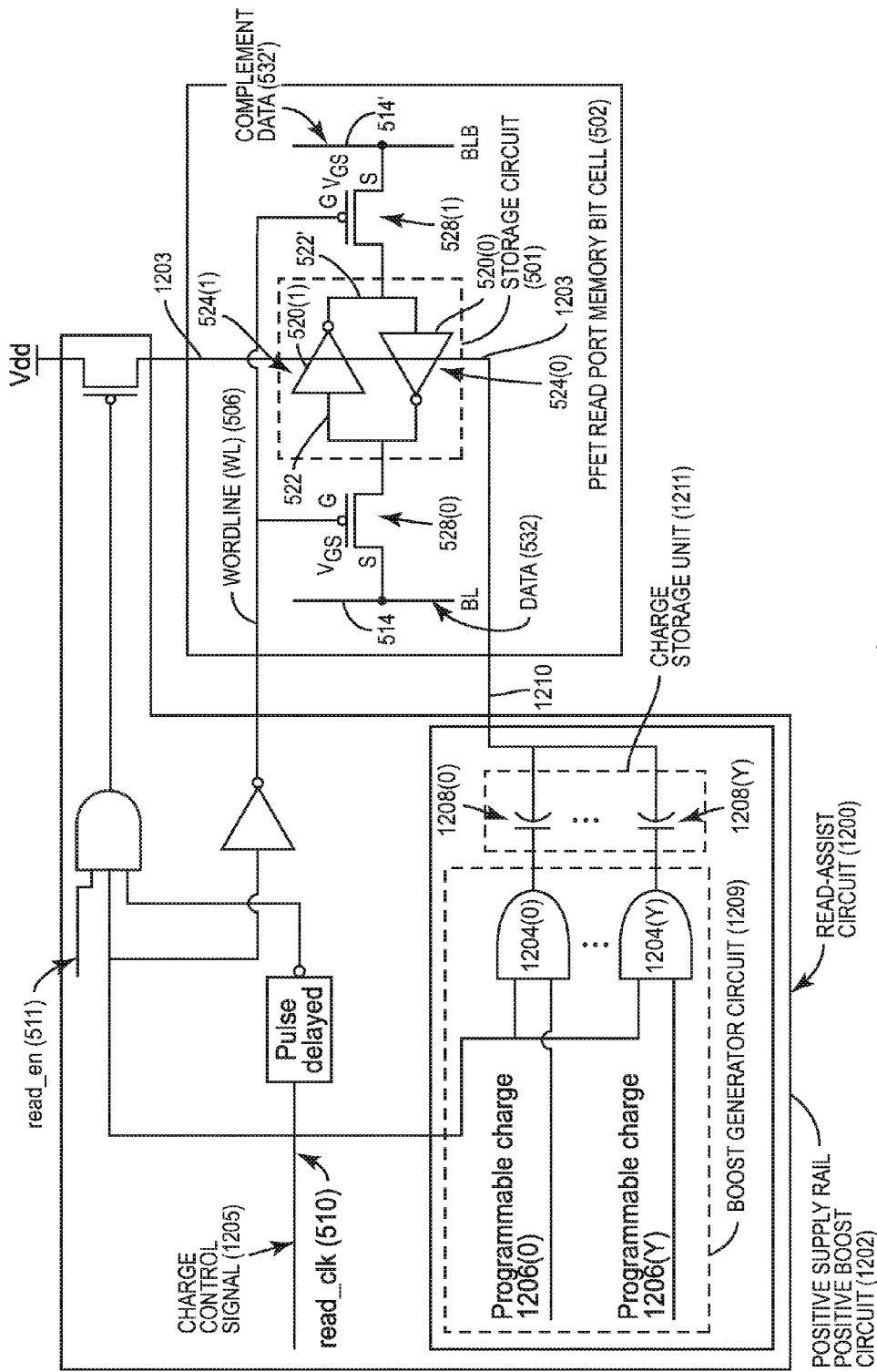
FIG. 12 illustrates an exemplary read-assist circuit that includes a positive supply rail positive boost circuit configured to positively boost a positive supply rail in a PFET(s) in a cross-coupled inverter storage circuit in the memory bit cell in FIG. 5B, to strengthen the PFETs in the storage circuit to be stronger than PFET access transistors in the memory bit cells in response to a read operation to mitigate or avoid a read disturb condition.

Also, as another example to mitigate or avoid read disturb conditions in the PFET read port memory bit cell 502 in the memory system 600 in FIG. 8, a read-assist circuit employing a positive supply rail positive boost circuit can be employed. The positive supply rail positive boost circuit is configured to strengthen a pull-up PFET in one or more inverters in a storage circuit 501 of the PFET read port memory bit cell 502 in response to a read operation (block 904C in FIG. 9). An examples of a memory system that includes a read-assist circuit employing a positive supply rail positive boost circuit for a PFET read port memory bit cell is shown in FIG. 12 discussed below.

Figure 10:
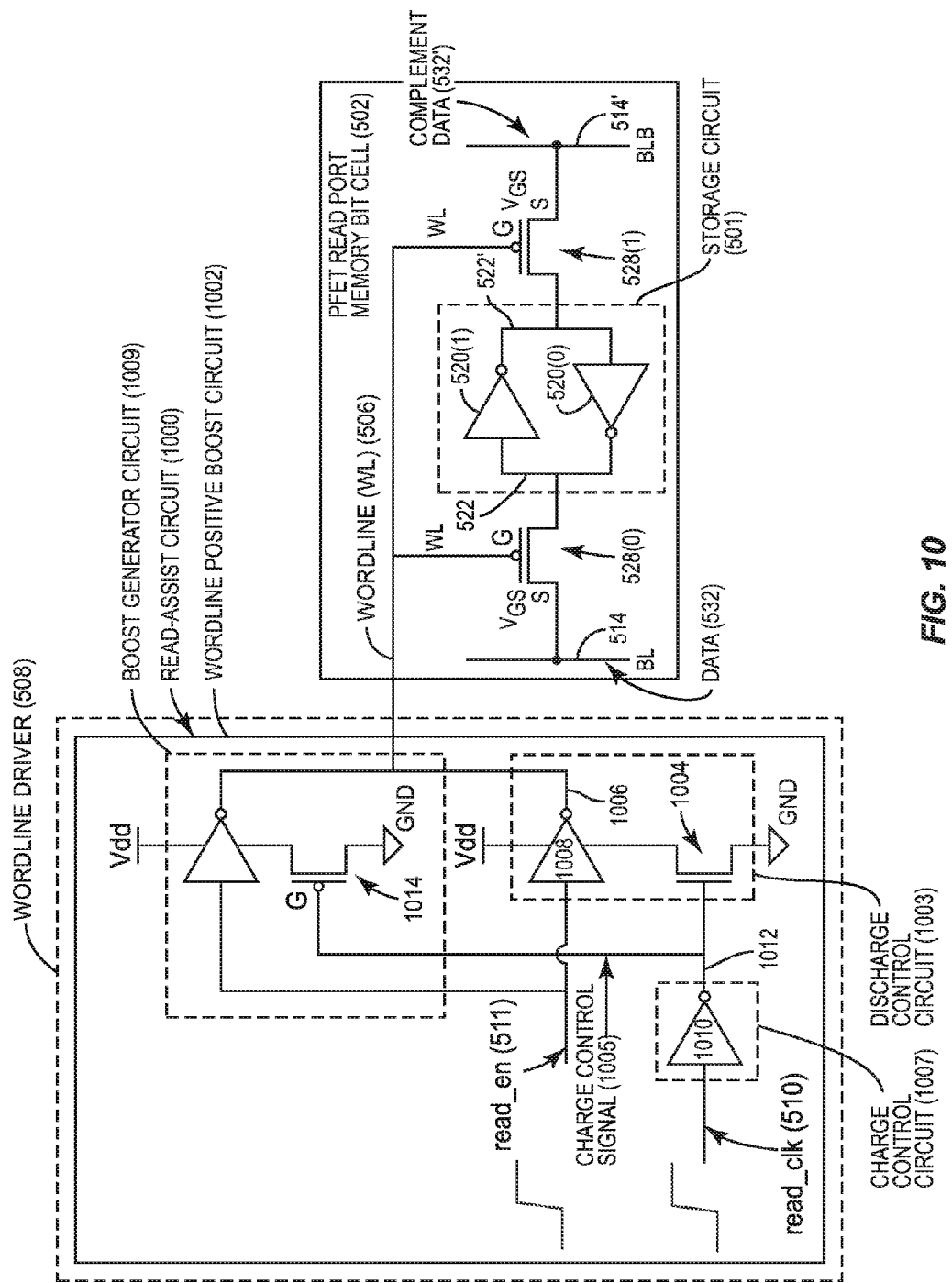
FIG. 10 illustrates an exemplary read-assist circuit that includes an exemplary positive wordline boost circuit provided in a wordline driver to positively boost a wordline of the memory bit cell in FIG. 5B to weaken PFET access transistors in the memory bit cell in response to a read operation to mitigate or avoid a read disturb condition.

In this regard, FIG. 10 illustrates an exemplary wordline driver 508 that includes a read-assist circuit 1000 in the form of a wordline positive boost circuit 1002 that can be included in the memory system 600 in FIG. 6 that includes the PFET-based sense amplifier 602. The wordline positive boost circuit 1002 in this example is configured to positively boost the voltage on the wordline (WL) 506 to weaken the PFET access transistors 528(0), 528(1) in response to a read operation to mitigate or avoid a read disturb condition from occurring. In this manner, the PFET access transistors 528(0) or 528(1) do not drive the voltages from the bit line 514 or the complement bit line 514' into the true storage node 522 or complement storage node 522', respectively, in response to a read operation, thus causing a read disturb condition. By boosting the voltage on the wordline (WL) 506, the drive current $I_D$ (i.e., drive strength) of the PFET access transistors 528(0), 528(1) is weakened according to the following saturation drive current equation by decreasing gate (G)-to-source (S) voltage ($V_{GS}$), as follows:

$$I_D = \tfrac{1}{2}\mu C_{ox} W/L (V_{GS} - V_{TH})^2$$

where:

$I_D$ is drive current,

'μ' is the charge carrier effective mobility,

'W' is the gate width,
'L' is the gate length,
'$C_{ox}$' is the capacitance of the oxide layer;
'$V_{GS}$' is the gate to source voltage, and
'$V_{TH}$' is the threshold voltage.

With reference to FIG. 10, to perform a read or write operation in the memory bit cell 502, the wordline (WL) 506 is driven to a logical '0' to turn on the PFET access transistors 528(0), 528(1) in the memory bit cell 502. In a read operation, the wordline (WL) 506 is driven to a logical '0' after the bit line 514 and the complement bit line 514' are pre-discharged. In this regard, the wordline driver 508 in FIG. 10 includes a discharge control circuit 1003. The discharge control circuit 1003 is coupled to the wordline (WL) 506. The discharge control circuit 1003 is configured to receive a charge control signal 1005 from a charge control circuit 1007 as an input. As discussed in more detail below, the discharge control circuit 1003 is configured to couple the wordline (WL) 506 to the ground node (GND) in response to the charge control signal 1005 indicating a charge disable state. However, as also discussed in more detail below, the discharge control circuit 1003 is also configured to decouple the wordline (WL) 506 from the ground node (GND) to leave the wordline (WL) 506 in a floating state to allow a boost generator circuit 1009 to positively boost the voltage on the wordline (WL) 506 in response to the charge control signal 1005 indicating a charge enable state. In this example, the discharge control circuit 1003 includes an NFET 1004. The NFET 1004 is activated during a read operation to drive the wordline (WL) 506 to a logical '0' to activate the PFET access transistors 528(0), 528(1) during a read operation, because the charge control signal 1005 is based on the read clock signal (read_clk) 510 inverted by inverter 1010 in the charge control circuit 1007. When a read operation is to be performed, a read enable signal (read_en) 511 transitions high to select the memory bit cell 502 for the read operation. An output 1012 of an inverter 1010 in the charge control circuit 1007 activates the NFET 1004 in the discharge control circuit 1003 to pass the GND voltage to the wordline (WL) 506. The NFET 1004 passes a strong logical '0' signal.

However, in response to a read operation, the NFET 1004 in the discharge control circuit 1003 is shut off due to the inverter 1008 inverting the read clock signal 510, which has transitioned from low to high, on the output 1012, which has transitioned from high to low. This leaves the wordline (WL) 506 floating. The boost generator circuit 1009 provided in the wordline positive boost circuit 1002 is activated based on the charge control signal 1005 and the read enable signal 511 in this example indicating a read operation, to positively boost the voltage of the wordline (WL) 506 to weaken the PFET access transistors 528(0), 528(1).

In this example, a PFET 1014 is included in the boost generator circuit 1009. The gate (G) of the PFET 1014, which is coupled to the output 1012 of the inverter 1010 in the charge control circuit 1007, is activated in response to a read operation to boost the wordline (WL) 506. When the read enable signal 511 is a logical '1', the PFET 1014 in the boost generator circuit 1009 passes a signal above GND voltage, between a threshold voltage (Vt) and GND voltage, to the wordline (WL) 506. This is because a PFET 1014 passes a weak logical '0' signal. Thus, instead of the wordline (WL) 506 being driven all the way down to the GND voltage (logical '0') in a charge disable state based on the charge control signal 1005 and read enable signal 511, the wordline (WL) 506 is driven to a voltage level between Vt and GND voltage. This has the effect of weakening the PFET access transistors 528(0), 528(1) to provide a read-assist during read operations in the memory bit cell 502. Thus, the drive strength of the pull-up PFETs 524(0), 524(1) in the inverters 520(0), 520(1) (see FIG. 5B) in the memory bit cell 502 can overcome the weakened PFET access transistors 528(0), 528(1) in response to a read operation to quickly re-charge any lost charge on a true storage node 522 or complement storage node 522' at a voltage of logical '1', which is to be coupled to the bit line 514 or complement bit line 514'.

FIG. 11 is a circuit diagram of a read-assist circuit 1100 in the form of a bit line positive boost circuit 1102 that can be provided in memory system 600 in FIG. 6 that includes the PFET-based sense amplifier 602. In this example, the bit line positive boost circuit 1102 is provided in a bit line driver 512 for a bit cell column N of the PFET read port memory bit cell 502. The bit line positive boost circuit 1102 is configured to boost the bit line 514 and complement bit line 514' in response to a read operation for the memory bit cell 502. In this regard, the memory bit cell 502 is provided just as illustrated in FIG. 5B, and thus will not be re-described.

With reference to FIG. 11, when performing a read operation on the memory bit cell 502, the bit line 514 and the complement bit line 514' are pre-discharged before the wordline (WL) 506 is asserted, as previously described above. However, in the memory bit cell 502 in FIG. 5B, and as shown in FIG. 11, the bit line 514 and the complement bit line 514' were pre-discharged to GND voltage. However, in this example in FIG. 11, the bit line positive boost circuit 1102 in this example includes PFETs 1104(0), 1104(1). This is opposed to, for example, providing NFETs for pre-discharging the bit line 514 and the complement bit line 514'. The PFETs 1104(0), 1104(1) in the bit line positive boost circuit 1102 are configured to pre-discharge the bit line 514 and the complement bit line 514', respectively, to the threshold voltage (Vt) of the PFETs 1104(0), 1104(1) in response to a pre-discharge enable 606. The PFETs 1104(0), 1104(1) do not pass a strong logical '0' voltage. Thus, the bit line 514 and the complement bit line 514' are positively boosted to the threshold voltage (Vt) of the respective PFETs 1104(0), 1104(1) above GND during the pre-discharge stage. Subsequently, when the wordline (WL) 506 is asserted to read the memory bit cell 502 in response to a read operation, the gate (G)-to-source (S) voltage ($V_{GS}$) of the PFET access transistor 528(0) or 528(1) is Vdd–Vt (i.e., Vdd voltage minus the threshold voltage (Vt) of the respective PFETs 1104(0), 1104(1)), which weakens the PFET access transistors 528(0), 528(1). This mitigates or avoids a read disturb condition that can occur when the true storage node 522 or the complement storage node 522' has a logical '1' voltage stored, as previously discussed above with regard to FIG. 5B.

It is also possible to increase the drive strength of the pull-up PFETs 524(0), 524(1) in the memory bit cell 502 in FIG. 5B, instead of or in addition to boosting the wordline (WL) 506 and/or boosting the bit line 514 and complement bit line 514' in the memory bit cell 502, to mitigate or avoid read disturb conditions in the memory bit cell 502. Boosting the pull-up PFETs 524(0), 524(1) in the memory bit cell 502 in response to a read operation allows the pull-up PFETs 524(0), 524(1) to quickly re-charge the true storage node 522 or the complement storage node 522' as the voltage at the true storage node 522 is discharged to the bit line 514. Thus, there is not sufficient loss of charge at the true storage node 522 or the complement storage node 522' to cause the respective inverters 520(0) or 520(1) to flip the voltage on the complement storage node 522' or the true storage node 522, respectively, from a logic '0' to a logic '1'.

In this regard, FIG. 12 illustrates an exemplary read-assist circuit 1200 in the form of a positive supply rail positive boost circuit 1202 that can be provided in the memory system 600 in FIG. 6 that includes the PFET-based sense amplifier 602. The positive supply rail positive boost circuit 1202 is configured to boost the voltage of a positive supply rail 1203 of the PFET read port memory bit cell 502 that receives a supply voltage (Vdd) coupled to the pull-up PFETs 524(0), 524(1) of the cross-coupled inverters 520(0), 520(1) (see also, FIG. 5A). In this regard, the positive supply rail positive boost circuit 1202 is configured to boost the voltage supplied to the pull-up PFETs 524(0), 524(1) to cause the pull-up PFETs 524(0), 524(1) to be stronger than the PFET access transistors 528(0), 528(1) in the memory bit cell 502 in response to a read operation to mitigate or avoid a read disturb condition. As discussed below, the positive supply rail positive boost circuit 1202 is configured to couple the pull-up PFETs 524(0), 524(1) to a higher voltage than voltage (Vdd) in this example.

In this regard, with reference to FIG. 12, when a read operation occurs according to the transition of the read clock signal 510 provided as a charge control signal 1205 to a higher voltage level, the read clock signal 510 is provided as input to a boost generator circuit 1209. In this example, the boost generator circuit 1209 is comprised of a plurality of charge generating circuits 1204(0)-1204(Y) provided in the form of AND gates. The charge generating circuits 1204(0)-1204(Y) also have respective programmable charge lines 1206(0)-1206(Y) that can be programmed to allow any number of the charge generating circuits 1204(0)-1204(Y) desired to charge respective charge storage circuits 1208(0)-1208(Y) provided in a charge storage unit 1211 in this example. The charge storage circuits 1208(0)-1208(Y) are capacitors in this example. During the read operation, the charge stored in the charge storage circuits 1208(0)-1208(Y) is coupled to an output 1210 of the charge storage unit 1211, which is coupled to the positive supply rail 1203 and to the pull-up PFETs 524(0), 524(1). In this manner, the charge discharged from the charge storage unit 1211 to the positive supply rail 1203 boosts the voltage coupled to the pull-up PFETs 524(0), 524(1) above voltage (Vdd), thus strengthening the pull-up PFETs 524(0), 524(1). During a write operation, the charge generating circuits 1204(0)-1204(Y) are not driving the output 1210 coupled to the positive supply rail 1203, and thus the output 1210 is left floating such that only voltage (Vdd) is coupled to the pull-up PFETs 524(0), 524(1) in the inverters 520(0), 520(1) for normal read operations.

The PFET-based sense amplifiers provided in memory systems for reading memory bit cells according to aspects disclosed herein, may be provided in or integrated into a memory in any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 13:
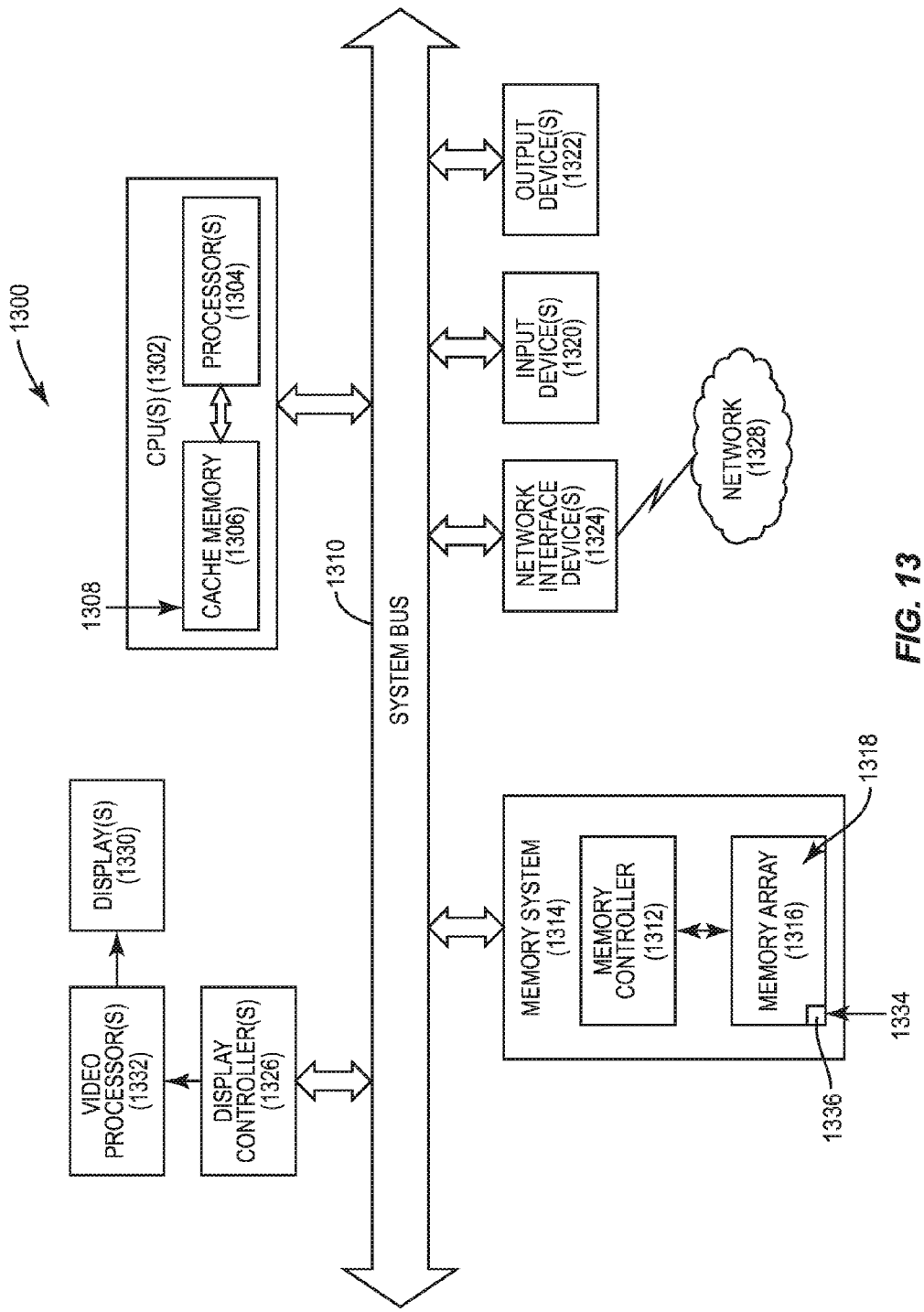
FIG. 13 is a block diagram of an exemplary processor-based system that can include memory systems that employ PFET-based sense amplifiers for reading PFET pass-gate memory bit cells, and according to any of the aspects disclosed herein.

In this regard, FIG. 13 illustrates an example of a processor-based system 1300 that can employ PFET-based sense amplifiers provided in memory systems according to aspects disclosed herein. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. The cache memory 1306 can employ PFET-based sense amplifiers 1308, including the PFET-based sense amplifier 602 illustrated in FIG. 6. The CPU(s) 1302 is coupled to a system bus 1310 and can intercouple master and slave devices included in the processor-based system 1300. As is well known, the CPU(s) 1302 communicates with these other devices by exchanging address, control, and data information over the system bus 1310. For example, the CPU(s) 1302 can communicate bus transaction requests to a memory controller 1312 in a memory system 1314 as an example of a slave device. Although not illustrated in FIG. 13, multiple system buses 1310 could be provided, wherein each system bus 1310 constitutes a different fabric. In this example, the memory controller 1312 is configured to provide memory access requests to a memory array 1316 in the memory system 1314. The memory array 1316 can also include PFET-based sense amplifiers 1318 to read the bit cells in the memory array 1316.

Other devices can be connected to the system bus 1310. As illustrated in FIG. 13, these devices can include the memory system 1314, one or more input devices 1320, one or more output devices 1322, one or more network interface devices 1324, and one or more display controllers 1326, as examples. The input device(s) 1320 can include any type of input device, including but not limited to input keys, switches, voice processors, etc. The output device(s) 1322 can include any type of output device, including but not limited to audio, video, other visual indicators, etc. The network interface device(s) 1324 can be any devices configured to allow exchange of data to and from a network 1328. The network 1328 can be any type of network, including but not limited to a wired or wireless network, a private or public network, a local area network (LAN), a wide local area network (WLAN), and the Internet. The network interface device(s) 1324 can be configured to support any type of communications protocol desired.

The CPU(s) 1302 may also be configured to access the display controller(s) 1326 over the system bus 1310 to control information sent to one or more displays 1330. The display controller(s) 1326 sends information to the display(s) 1330 to be displayed via one or more video processors 1332, which process the information to be displayed into a format suitable for the display(s) 1330. The display(s) 1330 can include any type of display, including but not limited to a cathode ray tube (CRT), a liquid crystal display (LCD), a plasma display, etc.

A non-transitory computer-readable medium, such as the memory system 1314 in FIG. 13 as a non-limiting example, may also have stored thereon computer data for an integrated circuit (IC). The computer data may be provided in the form of a library cell 1334 in a cell library in this example. The computer data, when executed, can cause the CPU 1302 to store the library cell 1334 for an IC or IC design. In this regard, in this example, the IC design is provided in the form of the library cell 1334 that comprises a library memory system 1336 based on employing a PFET-based sense amplifier(s) for reading PFET pass-gate memory bit cells discussed herein. As discussed above, such a memory system can comprise a memory bit cell. The memory bit cell comprises a storage circuit configured to store data. The memory bit cell also comprises one or more PFET access transistors configured to pass the stored data from the storage circuit to a respective bit line among one or more bit lines in response to a read operation. The memory system also comprises a sense amplifier. The sense amplifier comprises one or more PFET sense transistors each configured to sense the data on a respective bit line among the one or more bit lines in response to the read operation.

Note that the use of PFET and NFET in this disclosure can include PMOSFETs and NMOSFETs that are metal oxide semiconductors (MOSs). The PFETs and NFETs discussed herein can include other types of oxide layers other than metal. Also note that any of the assist circuits disclosed herein can be provided for either or both of the bit line and complement bit line of the bit cells disclosed herein.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory system, comprising:
    a memory bit cell comprising:
        a storage circuit configured to store data; and
        one or more P-type Field-effect Transistor (PFET) access transistors configured to pass the stored data from the storage circuit to a respective bit line among one or more bit lines in response to a read operation; and
    a sense amplifier comprising:
        a latch circuit, comprising:
            one or more storage nodes;
            one or more pull-up circuits each coupled to a respective storage node among the one or more storage nodes, wherein each pull-up circuit of the one or more pull-up circuits comprises at least one PFET transistor; and
            one or more pull-down circuits each coupled to a respective pull-up circuit among the one or more pull-up circuits and the respective storage node coupled to the respective pull-up circuit, wherein each pull-down circuit of the one or more pull-down circuits comprises at least one N-type FET (NFET) transistor;
        one or more PFET sense transistors coupled to the respective bit line among the one or more bit lines and the respective pull-up circuit among the one or more pull-up circuits in the latch circuit, the one or more PFET sense transistors each configured to sense the data on the respective bit line among the one or more bit lines in response to the read operation and control coupling of a voltage supply of a supply voltage to the respective pull-up circuit based on a state of the data on the respective bit line; and
        a second pull-up circuit comprising at least one PFET transistor and configured to electrically couple the voltage supply to the one or more PFET sense transistors in response to a sense amplifier enable signal indicating a sense state.

2. The memory system of claim 1, wherein the one or more PFET sense transistors of the sense amplifier are each configured to sense the data from the memory bit cell in response to the sense amplifier enable signal indicating the sense state in response to the read operation.

3. The memory system of claim 1, wherein the latch circuit is configured to be activated to store the sensed data in the one or more storage nodes in response to the voltage supply being coupled to the respective pull-up circuit.

4. The memory system of claim 1, further comprising a pre-discharge circuit configured to pre-discharge the one or more bit lines coupled to the one or more PFET sense transistors to a ground voltage node in response to a sense amplifier pre-discharge enable signal indicating a pre-discharge state.

5. The memory system of claim 4, wherein the pre-discharge circuit comprises at least one pull-down NFET coupled between the ground voltage node and the one or more bit lines.

6. The memory system of claim 1, wherein the one or more PFET sense transistors in the sense amplifier comprises:
a first PFET sense transistor coupled to a first bit line among the one or more bit lines and a first pull-up circuit among the one or more pull-up circuits in the latch circuit, the first PFET sense transistor comprising a first gate configured to be activated by the first bit line in response to the read operation to cause the first PFET sense transistor to couple the voltage supply to the first pull-up circuit; and
a second complement PFET sense transistor coupled to a complement bit line among the one or more bit lines and the second pull-up circuit among the one or more pull-up circuits in the latch circuit, the second complement PFET sense transistor comprising a second gate configured to be activated by the complement bit line in response to the read operation to cause the second complement PFET sense transistor to couple the voltage supply to the second pull-up circuit.

7. The memory system of claim 6, wherein the latch circuit comprises a first inverter comprising a first input coupled to a second storage node and a second inverter comprising a second input coupled to a first storage node.

8. The memory system of claim 1, further comprising a plurality of memory bit cell columns each comprising a plurality of memory bit cells.

9. The memory system of claim 8, further comprising a column selection circuit configured to couple the one or more PFET sense transistors of the sense amplifier to the one or more bit lines of a memory bit cell column among the plurality of memory bit cell columns, in response to a column select signal selecting the memory bit cell column among the plurality of memory bit cell columns.

10. The memory system of claim 1, wherein each of the one or more PFET access transistors of the memory bit cell comprises a gate configured to be activated by a wordline in response to the read operation to cause the one or more PFET access transistors to pass the data from the storage circuit to the respective bit line among the one or more bit lines.

11. The memory system of claim 1, further comprising a read-assist circuit configured to boost a voltage in the memory bit cell in response to the read operation to assist in transferring the data from the storage circuit to the one or more bit lines.

12. The memory system of claim 11, wherein the one or more PFET access transistors each further comprises a source; and
the read-assist circuit configured to positively boost the voltage across a gate (G)-to-source (S) voltage ($V_{GS}$) of the one or more PFET access transistors in response to the read operation to assist in passing the data from the storage circuit to the one or more bit lines.

13. The memory system of claim 11, wherein the read-assist circuit comprises a wordline positive boost circuit coupled to a wordline, the wordline positive boost circuit configured to positively boost the voltage on the wordline to positively boost a voltage of a gate of the one or more PFET access transistors in response to the read operation.

14. The memory system of claim 11, wherein the read-assist circuit comprises a bit line positive boost circuit coupled to a bit line, the bit line positive boost circuit configured to positively boost the voltage on the bit line to positively boost a gate voltage to a gate (G)-to-source (S) voltage ($V_{GS}$) of the one or more PFET access transistors in response to the read operation.

15. The memory system of claim 11, wherein:
the storage circuit further comprises:
a positive supply rail;
one or more inverters each comprising a pull-up PFET coupled to a pull-down NFET; and
the pull-up PFET of the one or more inverters coupled to the positive supply rail; and
the read-assist circuit comprises a positive supply rail positive boost circuit coupled to the positive supply rail of at least one inverter among the one or more inverters, the positive supply rail positive boost circuit configured to positively boost the voltage on the positive supply rail to strengthen the one or more inverters in the storage circuit in response to the read operation.

16. The memory system of claim 10, wherein the one or more PFET access transistors in the memory bit cell comprises:
a first PFET access transistor coupled to the storage circuit, the first PFET access transistor comprising a first gate configured to be activated by the wordline in response to the read operation to cause the first PFET access transistor to pass the data from the storage circuit to the bit line; and
a second complement PFET access transistor coupled to the storage circuit, the second complement PFET access transistor comprising a second gate configured to be activated by the wordline in response to the read operation to cause the second complement PFET access transistor to pass complement data to the data from the storage circuit to a complement bit line.

17. The memory system of claim 1 provided in a processor-based system.

18. The memory system of claim 17, wherein the processor-based system is comprised of a central processing unit (CPU)-based system.

19. The memory system of claim 1 integrated into a system-on-a-chip (SoC).

20. The memory system of claim 1 integrated into a device selected from the group consisting of: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

21. A method of sensing data from a memory bit cell, comprising:
pre-discharging one or more bit lines each coupled to an access node of a P-type Field-effect Transistor (PFET) access transistor among one or more PFET access transistors in a memory bit cell in response to a read operation;
activating a wordline coupled to a gate of the one or more PFET access transistors in response to the read operation to transfer data stored in a storage circuit to the access node and the one or more bit lines;
sensing the data on a respective bit line among the one or more bit lines in one or more PFET sense transistors in a sense amplifier in response to the read operation, each of the one or more PFET sense transistors coupled to the respective bit line and a respective pull-up circuit among one or more pull-up circuits in a latch circuit;

controlling coupling of a voltage supply of a supply voltage to the respective pull-up circuit based on a state of the data sensed on the respective bit line;

supplying the supply voltage to the one or more PFET sense transistors using at least one PFET transistor configured to supply the supply voltage in response to a sense amplifier enable signal indicating a sense state; and latching the sensed data in one or more storage nodes in the latch circuit in response to receiving the supply voltage from the one or more PFET sense transistors, the latch circuit comprising:

the one or more pull-up circuits each coupled to a respective storage node among the one or more storage nodes, wherein each pull-up circuit of the one or more pull-up circuits comprises at least one PFET transistor; and one or more pull-down circuits each coupled to the respective pull-up circuit among the one or more pull-up circuits and the respective storage node coupled to the respective pull-up circuit, wherein each pull-down circuit of the one or more pull-down circuits comprises at least one N-type FET (NFET) transistor.

22. The method of claim 21, wherein sensing the data further comprises sensing the data on the respective bit line among the one or more bit lines in response to the sense amplifier enable signal indicating the sense state in response to the read operation.

23. The method of claim 21, further comprising pre-discharging the one or more bit lines coupled to the one or more PFET sense transistors to a ground voltage node in response to a sense amplifier pre-discharge enable signal indicating a pre-discharge state.

24. The method of claim 21, wherein sensing the data on the respective bit line among the one or more bit lines in response to the read operation comprises:

activating a first gate of a first PFET sense transistor among the one or more PFET sense transistors coupled to a first bit line among the one or more bit lines and a first pull-up circuit among the one or more pull-up circuits in the latch circuit, to cause the first PFET sense transistor to couple the voltage supply to the first pull-up circuit; and activating a second gate of a second complement PFET sense transistor among the one or more PFET sense transistors coupled to a complement bit line among the one or more bit lines and a second pull-up circuit among the one or more pull-up circuits in the latch circuit, to cause the second PFET sense transistor to couple the voltage supply to the second pull-up circuit.

25. The method of claim 21, further comprising selectively coupling the one or more PFET sense transistors of the sense amplifier to the one or more bit lines of a memory bit cell column among a plurality of memory bit cell columns, the memory bit cell column comprising a plurality of memory bit cells, in response to a column select signal selecting the memory bit cell column.

26. The method of claim 21, further comprising boosting a voltage in the memory bit cell in response to the read operation to assist in transferring the data from the storage circuit to the one or more bit lines.

27. The method of claim 26, wherein boosting the voltage comprises positively boosting the voltage across a gate (G)-to-source (S) voltage ($V_{GS}$) of the one or more PFET access transistors in response to the read operation to assist in passing the data from the storage circuit to the one or more bit lines.

28. The method of claim 26, wherein boosting the voltage comprises positively boosting the voltage on the wordline coupled to the gate of the one or more PFET access transistors to positively boost a voltage of the gate of the one or more PFET access transistors in response to the read operation.

29. The method of claim 26, wherein boosting the voltage comprises positively boosting a voltage on the one or more bit lines to negatively boost a gate (G)-to-source (S) voltage ($V_{GS}$) of the one or more PFET access transistors in response to the read operation.

30. The method of claim 26, wherein boosting the voltage comprises positively boosting a voltage on a positive supply rail coupled to a pull-up PFET in one or more inverters in the storage circuit to strengthen the one or more inverters in response to the read operation.

31. A non-transitory computer-readable medium having stored thereon computer data for an integrated circuit (IC), the IC comprising:

a memory system, comprising:
a memory bit cell comprising:
a storage circuit configured to store data; and
one or more P-type Field-effect Transistor (PFET) access transistors configured to pass the stored data from the storage circuit to a respective bit line among one or more bit lines in response to a read operation; and a sense amplifier comprising:
a latch circuit, comprising:
one or more storage nodes;
one or more pull-up circuits each coupled to a respective storage node among the one or more storage nodes, wherein each pull-up circuit of the one or more pull-up circuits comprises at least one PFET transistor; and
one or more pull-down circuits each coupled to a respective pull-up circuit among the one or more pull-up circuits and the respective storage node coupled to the respective pull-up circuit, wherein each pull-down circuit of the one or more pull-down circuits comprises at least one N-type FET (NFET) transistor;

one or more PFET sense transistors coupled to the respective bit line among the one or more bit lines and the respective pull-up circuit among the one or more pull-up circuits in the latch circuit, the one or more PFET sense transistors each configured to sense the data on the respective bit line among the one or more bit lines in response to the read operation and control coupling of a voltage supply of a supply voltage to the respective pull-up circuit based on a state of the data on the respective bit line; and a second pull-up circuit comprising at least one PFET transistor and configured to electrically couple the voltage supply to the one or more PFET sense transistors in response to a sense amplifier enable signal indicating a sense state.

* * * * *